(12) United States Patent
Shachar et al.

(10) Patent No.: US 11,224,874 B2
(45) Date of Patent: Jan. 18, 2022

(54) APPARATUS FOR AUTOMATIC SAMPLING OF BIOLOGICAL SPECIES EMPLOYING DISK MICROFLUIDICS SYSTEM

(71) Applicant: Sensor Kinesis Corp., Los Angeles, CA (US)

(72) Inventors: Josh Yehoshua Shachar, Santa Monica, CA (US); Sam Gurley, South Pasadena, CA (US); Aaron Cipriano, Fullerton, CA (US); Peter Yin, Culver City, CA (US); Rob Purnell, Los Angeles, CA (US); Marc Rocklinger, Marina del Rey, CA (US); Ming Petrullo, Redondo Beach, CA (US); Stelica Stelea, Yorba Linda, CA (US)

(73) Assignee: Autonomous Medical Devices Inc., Santa Monica, CA (US)

( * ) Notice: Subject to any disclaimer, the term of this patent is extended or adjusted under 35 U.S.C. 154(b) by 160 days.

(21) Appl. No.: 16/285,092

(22) Filed: Feb. 25, 2019

(65) Prior Publication Data
US 2019/0201900 A1 Jul. 4, 2019

Related U.S. Application Data

(63) Continuation-in-part of application No. 16/152,029, filed on Oct. 4, 2018.
(Continued)

(51) Int. Cl.
*B01L 3/00* (2006.01)
*G01N 29/02* (2006.01)
(Continued)

(52) U.S. Cl.
CPC ... *B01L 3/502761* (2013.01); *B01L 3/502715* (2013.01); *B01L 3/502753* (2013.01);
(Continued)

(58) Field of Classification Search
CPC .. B01L 3/502761; B01L 3/5027; B01L 3/502; B01L 3/50; B01L 3/502715; H03H 9/14505
(Continued)

(56) References Cited

U.S. PATENT DOCUMENTS

| | | | | |
|---|---|---|---|---|
| 2006/0205061 A1* | 9/2006 | Roukes | ............ | G01N 33/54366 435/287.2 |
| 2012/0329142 A1* | 12/2012 | Battrell | .................. | C12Q 1/686 435/287.2 |

* cited by examiner

*Primary Examiner* — Christine T Mui
(74) *Attorney, Agent, or Firm* — Marcus C. Dawes; Daniel L. Dawes

(57) ABSTRACT

A field portable diagnostic apparatus uses a rotatable disk in which a microfluidic circuit is defined. The microfluidic circuit includes a centrifugal separation chamber receiving a sample to stratify the sample. A magnetic bead holding chamber is communicated to a mixing chamber, where mass amplifying functionalized magnetic-nanoparticles, held in a buffer solution and contained in the magnetic bead holding reservoir communicated to mixing chamber, are mixed with the separated fluid delivered to mixing chamber from the separation chamber. The functionalized magnetic nanoparticles conjugate with a target analyte in the sample. A magnet in proximity to a SAW chamber including a SAW detector draws the functionalized magnetic nanoparticles toward antibodies immobilized on the SAW sensor surface A wash reservoir is communicated to the SAW sensor chamber, and a cleanup/waste reservoir is communicated to the SAW chamber for receive fluid after it has passed through the SAW chamber.

11 Claims, 21 Drawing Sheets

Related U.S. Application Data

(60) Provisional application No. 62/597,202, filed on Dec. 11, 2017.

(51) Int. Cl.
*H03H 9/02* (2006.01)
*H03H 9/145* (2006.01)
*G01N 29/036* (2006.01)

(52) U.S. Cl.
CPC ............... *B01L 2200/0668* (2013.01); *B01L 2300/0803* (2013.01); *B01L 2300/087* (2013.01); *B01L 2300/0864* (2013.01); *B01L 2400/043* (2013.01); *B01L 2400/0409* (2013.01); *B01L 2400/0677* (2013.01); *G01N 29/022* (2013.01); *G01N 29/036* (2013.01); *G01N 2291/0255* (2013.01); *G01N 2291/0256* (2013.01); *G01N 2291/0423* (2013.01); *H03H 9/02866* (2013.01); *H03H 9/14505* (2013.01)

(58) Field of Classification Search
USPC .................................... 422/502, 500, 50
See application file for complete search history.

TABLE 1

| Step | Description | Protocol | Time (min) |
|---|---|---|---|
| 1 | Insert Blood & Spin to BP Chamber | 0 rpm | .5 |
| 2 | BP Separation | 5000 rpm | 1-3 |
| 3, 4 | Siphon Priming and Spin to Mixing | 500 rpm; 2000 rpm | .5 |
| 5 | Mix MNPs with Plasma | Oscillate: 2 Hz, 300° | 1-3 |
| 6 | Laser Valve Opens & Spin to SAW Chamber | 0 rpm; 2000-5000 rpm, acc: 500 rpm/s | .5 |
| 7 | Homogenization of MNPs & Surface Conjugation | Oscillation: 2 Hz, 300° | 5-20 |
| 8 | Siphon Priming and Spin to Waste | 500 rpm; 2000 rpm | .5 |
| 9 | Flow Through Wash 1 and 2 into SAW Chamber | 2000 rpm | 2 |
| 10 | Spin Dry SAW Chamber and Detect | 3000 rpm; 0 rpm | 2 |
| | Current Estimated Time | | 13-32 min |

FIG. 7

$$\vec{F}_{tot} = \underbrace{\rho\vec{\omega}(\vec{\omega}\times\vec{r})}_{\text{Centrifugal}} - \underbrace{2\rho\vec{\omega}\times\frac{d\vec{r}}{dt}}_{\text{Coriolis}} - \underbrace{\rho\frac{d\vec{\omega}}{dt}\times\vec{r}}_{\text{Euler}}$$

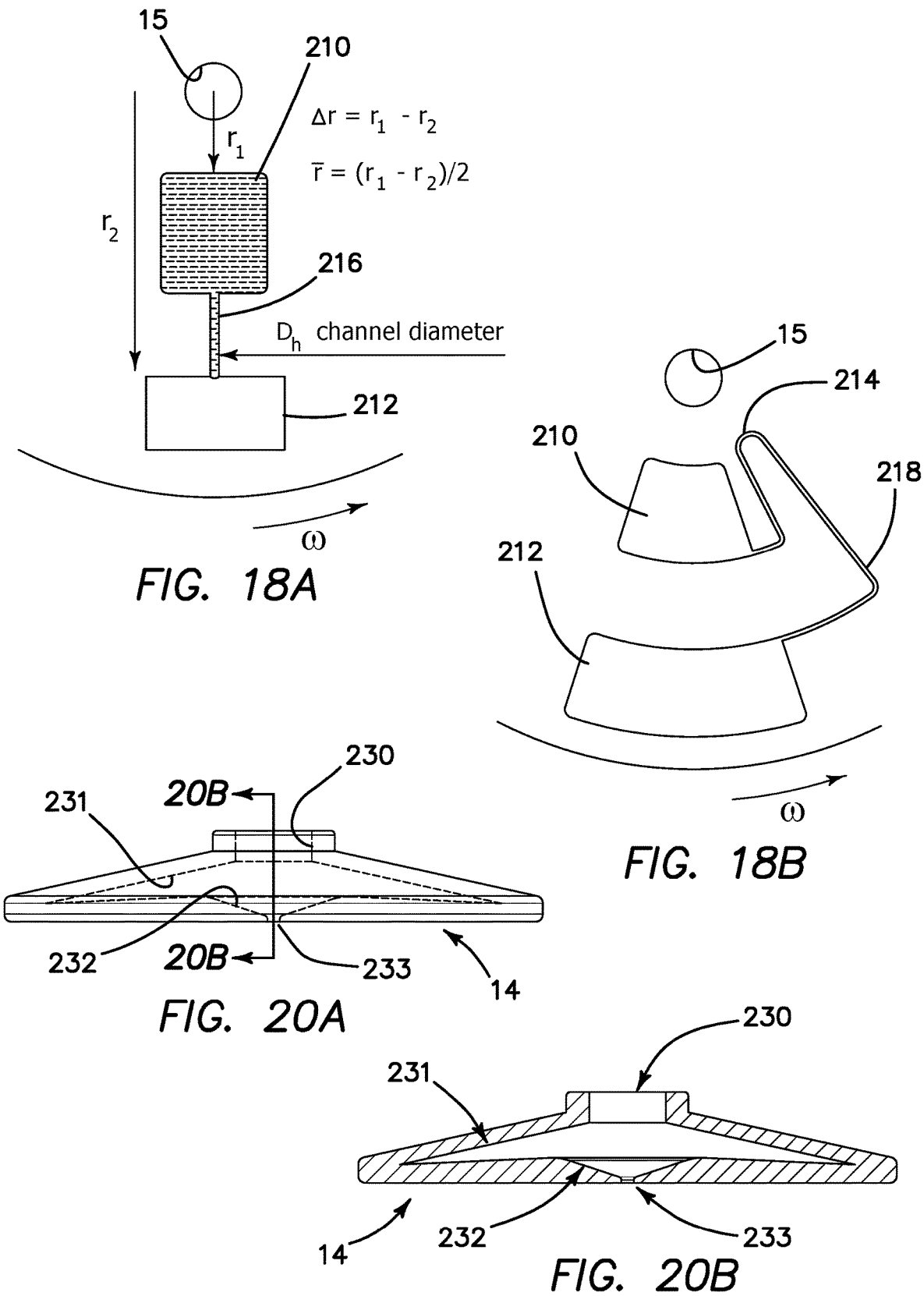

APPARATUS FOR AUTOMATIC SAMPLING OF BIOLOGICAL SPECIES EMPLOYING DISK MICROFLUIDICS SYSTEM

RELATED APPLICATIONS

The present application is related to U.S. patent application Ser. No. 16/152,029, filed on Oct. 4, 2018, which in turn related to U.S. Provisional Application, 62/597,202, filed on Dec. 11, 2017, which nonprovisoional application is a continuation in part of U.S. patent application Ser. No. 15/597,090, filed on May 16, 2017, all of which are incorporated herein by reference and to which priority is claimed pursuant to 35 USC 119, 120.

BACKGROUND

Field of the Technology

The invention relates to the field of surface acoustic wave (SAW) analyzers for use as handheld, field portable analyzers communicated through conventional cellphones, tablets, iPad or other internet connected devices to the cloud, and methods of operating the same. More particularity, the invention is directed to the use of a microfluidic disk to prepare a biological sample for diagnostic testing.

The use of a microfluidic disk enables a series of sequences required for an ELISA-like immunoassay sandwich to be formed from a complex serum, such as blood, saliva or urine, onto a sensor surface, and to produce a wash to remove any nonspecific binding and to provide a dry the sensor surface.

Description of the Prior Art

The aim of setting humanity on the path to autonomous healthcare for the individual is clearly constrained by existing socioeconomical and geographical parameters. The ability of an individual, as well as entire communities, the ability to access to diagnostic screenings for potential maladies is limited by the fact that diagnostic medicine employ a complex and expensive apparatus, operated by expert users and such equipment is located within large medical laboratories and or hospitals. There by the technology is defining limitation of enabling large segments of the world population from accessing the critical parameter and the most important pre-requisite for measuring their health conditions. It is therefore clear that access of diagnostic medicine on demand by individual or communities not living in a large metropolitan is the reason for the substantial disparity of illness, morbidity and death by rural communities as well as underdeveloped countries.

This quantitative measure of "Health" is defined by the measurable parameter we titled by the term "access" of patient and communities to such diagnostic medical practices.

This application and its innovative approach to sensor sensitivity, biological probe(s), microfluidic emulating the entire lab capabilities as well as analysis of the generated clinical data, dissemination of such data via wireless communication, portability as well as immediate response of the system is the hallmark of this application. As a result of these series of inventive steps we predicted that the gap associated with the disparity of poor and geographical distanced communities to diagnostic medicine can be reduced and that such improvements is measurable by increase access reduce morbidity and death as reported by many studies on the topic of democratization of diagnostic medicine.

As disclosed below access to easy, portable and on demand medical diagnostics is possible, but from development to distribution, many technological undertakings look only to communities of affluent individuals in the developed markets as their target market, while poor and under-developed markets are deprived of all but the most basic medical care or are limited to a trickle down of medical necessities. The development of a portable, automated screening apparatus with accessibility, spanning broad swaths of socioeconomic levels and geographies, is an object of the invention and is described under the heading of "Democratization of Diagnostic Medicine".

The path for the technology to enable an individual to test his or her medical condition has previously been contingent on the ability to reduce the complexity of biochemical or biological tests by screenings of bodily fluids through the use of the services of an institutional laboratory. These illustrated embodiments of the invention described below, center on transferring such processes to a field-automated, portable disposable apparatus operated by an unskilled user.

The challenge is not solely an issue of elimination of the use of large or complex lab equipment and highly trained lab personnel, but requires surmounting a myriad of physical, biochemical and other inherent constraints outlined below to which illustrated embodiments of the invention provide a solution.

The automation of biochemical sequencing to detect the presence of a virus, protein, exosome DNA or RNA within a complex assay of blood, saliva, urine or any other bodily fluids does not merely involve the geometrical and metric miniaturization of preexisting equipment, but involves overcoming limitations of many laws of physics, such as the limitations imposed: (1) by the diffusion coefficient (D) of an analyte (determined by viscosity, particle size, and temperature); (2) by flow characteristics of the bodily fluid sample (Navier Stocks) the modeling of rate of flow relative to conjugation rate (K)); (3) by the inherent association and dissociation of a particular analyte to its antibody (Kd); and (4) by ultimately providing for a system and method, which addresses the clinical resolution of the measuring apparatus, (sensitivity) where through its principles of its operation, it can discern between false positive and false negatives results, employing artificial intelligence algorithms (AI) to form a decision about the data generated by the system relative to a known clinical; standard.

As disclosed below access to easy, portable and on demand medical diagnostics is possible, but from development to distribution, many technological undertakings look only to communities of affluent individuals in the developed markets as their target market, while poor and underdeveloped markets are deprived of all but the most basic medical care or are limited to a trickle down of medical necessities. The development of a portable, automated screening apparatus with accessibility, spanning broad swaths of socioeconomic levels and geographies, is an object of the invention and is described under the heading of "Democratization of Diagnostic Medicine".

The path for the technology to enable an individual to test his or her medical condition has previously been contingent on the ability to reduce the complexity of biochemical or biological tests by screenings of bodily fluids through the use of the services of an institutional laboratory. These illustrated embodiments of the invention described below center on transferring such processes to a field-automated, portable disposable apparatus operated by an unskilled user.

The challenge is not solely an issue of elimination of the use of large or complex lab equipment and highly trained lab personnel, but requires surmounting a myriad of physical, biochemical and other inherent constraints outlined below to which illustrated embodiments of the invention provide a solution.

SUMMARY OF THE INVENTION

The efforts in developing a point of care diagnostic medical apparatus noted by the prior art, and its embodiments defined by the patents and the applications described above, must take in consideration that such device can be used by an individual whereby the entire process of delivering a sample of blood to the apparatus, separating such sample to its constituents (blood plasma fractionation), mixing of the plasma with its specific antibody while providing the a homogeneous assay, thereafter delivering such immunoassay to the capture probe on the sensor' surface for detection, is a necessary steps in achieving a point of care diagnostic. Such process of automation is the purpose of the application and it is centered on the ability of the apparatus to form an automated sequencing of this biochemicals events within the constrains associated with the fact that it is a field operated process without the use of expensive lab equipment as well as trained technical staff.

To enable the use of the Surface Acoustic Wave Biosensing apparatus as it is described by US patent application noted above, this application reports on new developments in centrifugal microfluidic technologies have the potential to establish wide-spread utilization of the sensor platform. This application presents a short review of the centrifugal microfluidic platform, while highlighting the progress and the preferred embodiments of the novel apparatus as it incorporate the entire sequence of the diagnostic process as an autonomous machine.

In particular this application describes a fully integrated apparatus, where it is simple and easy to operate, inexpensive and accurate microfluidic tools in the area of in vitro bodily fluids analysis for near real time medical diagnostics.

The illustrated embodiments of the invention include a field portable diagnostic apparatus. The apparatus includes a rotatable disk having a center into which a plurality of chambers, reservoirs and channels are defined, which comprise a microfluidic circuit. A septum provides closure of the microfluidic circuit while allowing insertion of a sample with a target analyte. A sample reservoir is sealed by the septum and holds the sample. The sample reservoir is defined into the disk at a first radial position, which can be characterized as an upstream position when visualized in terms of the forces applied to fluid and other components in the fluid when the disk is spinning.

A separation chamber communicates to sample reservoir. The separation chamber defined into the disk beginning at a second radial position further from the center of the disk than the first radial position of the sample reservoir or is downstream from the sample chamber. The sample is stratified in the separation chamber by centrifugal forces.

A magnetic bead holding reservoir is defined into the disk beginning at a third radial position further from the center of the disk than the first radial position of the sample reservoir or upstream from a mixing chamber. A separation siphon is communicated to the separation chamber. The mixing chamber is communicated to the separation chamber through the separation siphon, where mass amplifying functionalized magnetic-nanoparticles, held in a buffer solution and contained in the magnetic bead holding reservoir communicated to mixing chamber, are mixed with the separated fluid delivered to mixing chamber from the separation chamber. The functionalized magnetic nanoparticles conjugate in the mixing chamber with a target analyte in the sample. The mixing chamber is defined into the disk beginning at a fourth radial position further from the center of the disk than the first, second and third radial positions or downstream from the separation chamber and from the magnetic bead reservoir.

A surface acoustic wave detector (SAW) having a SAW sensor surface is provided in a SAW chamber. A first valve-controlled channel is defined in the disk. The surface acoustic wave (SAW) chamber is communicated to mixing chamber through the first valve-controlled channel. The SAW sensing chamber contains the surface acoustic wave detector (SAW). The SAW chamber is defined into the disk beginning at a sixth radial further from to the center of the disk than the fourth radial position or downstream from the mixing chamber. A movable magnet is selectively positionable in proximity to the SAW chamber to draw the functionalized magnetic nanoparticles toward antibodies immobilized on the SAW sensor surface.

A second valve controlled channel is defined in the disk. A phosphate buffered saline solution (PBS) wash reservoir is communicated to the SAW sensor chamber, which PBS wash reservoir contains a PBS solution that is released into the SAW sensor chamber containing the conjugated magnetic nanoparticles through the second valve controlled channel. The PBS wash reservoir is defined into the disk beginning at a fifth radial position closer to the center of the disk than the fourth radial position or upstream from the SAW chamber.

A third valve controlled channel is defined in the disk. A deionized (DI) water wash reservoir is communicated with SAW sensor chamber through the third valve controlled channel, which DI wash reservoir contains DI water that is released sequentially following release from the PBS wash reservoir into the SAW sensor chamber containing the conjugated magnetic nanopartides. The DI water wash chamber defined into the disk beginning at the same fifth radial position closer to the center of the disk than the fourth radial position or upstream from the SAW chamber.

A waste siphon is communicated to the SAW chamber. A cleanup/waste reservoir is communicated by the waste siphon with the SAW chamber and holds fluid after it has passed through the SAW chamber.

The apparatus of claim 1 where the movable magnet is selectively positionable in proximity to the SAW sensor chamber to assist diffusion of magnetic nanoparticles to the SAW sensor surface.

In the illustrated embodiment the first, second and third valve controlled channels are each controlled by an active valve. The active valve includes a thermally activated laser valve. The thermally activated laser valve comprises a laser and a meltable plastic polymer or wax plug disposed in the channel.

In another embodiment the first, second and third controlled channels each comprise a passive valve.

In yet another embodiment a channel is provided communicating the magnetic bead reservoir and mixing chamber and a valve disposed in the channel.

The apparatus further includes a reader having a disk motor to rotate the disk, a magnet motor to move the magnet, an RF interposer arm, control, data and power circuitry coupled to the disk motor, magnet motor and RF interposer arm to control and operate the apparatus.

The SAW comprises multiple functionalized sensing lanes and a reference lane.

The apparatus further includes a laser and an encoder to determine a precise position of the disk relative to the laser, the laser being used to operate the active valves.

The illustrated embodiments of the invention include within their scope a method for operating a field portable diagnostic apparatus having a microfluidic circuit defined in a rotatable disk with a center including the steps of: disposing a sample having at least one analyte therein into a sample reservoir defined in the disk; disposing the disk into a reader; spinning the disk in the reader in a separation step at a separation rate for a separation time to separate the sample into separated components; moving a separated component into a mixing chamber by spinning the disk; mixing functionalized magnetic nanoparticles with the separated component in a mixing chamber by spinning the disk using selectively reversed or oscillating cycles of rotation; immobilizing conjugated functionalized magnetic nanoparticles in the mixing chamber by applying a magnetic field to the mixing chamber and thereafter removing unconjugated functionalized magnetic nanoparticles in the mixing chamber by spinning the disk with the magnetic field in place in a fluid exchange step; resuspending the conjugated functionalized magnetic nanoparticles in a PBS buffer and simultaneously transferring the conjugated functionalized magnetic nanoparticles to a SAW chamber by spinning the disk in a conjugation step; washing the conjugated functionalized magnetic nanopartides in the SAW chamber with a PBS solution by spinning the disk in a wash step; spin drying a SAW detector in the SAW chamber to remove all fluid from the SAW detector by spinning the disk in a spin-dry step; positioning the disk to couple an RF isolator arm to the disk to power the SAW detector; and measuring the at least one analyte in the SAW detector in a measurement step.

The separation step is performed by spinning the disk at 5000 to 6000 rpm for 1 to 3 minutes.

The mixing step is performed by oscillating the disk at a frequency between 1-2 Hz and oscillation angle between 180-360 degrees and for a total spin time of 1 to 3 minutes. FIG. 15 is a perspective view of mixing chamber 16 shown in isolation. Chamber 16 is V-shaped to enhance the effect of Euler forces in mixing the contained particles during oscillation. Chamber 16 has a funnel shape 17 in its lowest or radial outermost extent to optimize the exit of magnetic particles when chamber 16 is opened and spun.

The fluid exchange step is performed by spinning the disk at 2000 to 3000 rpm.

The conjugation step is performed by oscillating the disk at a frequency between 1-2 Hz and oscillation angle between 180-360 degrees and for a total spin time of 5 to 20 minutes.

The wash step is performed by spinning the disk at 2000 to 3000 rpm for 0.5 to 1 minutes.

The spin dry step is performed by spinning the disk at 3000 to 6000 rpm for 1 to 2 minutes.

The measurement step is performed without spinning the disk.

In the illustrated method all steps are performed the field within 13 to 32 minutes and all flow of fluid in a fluidic circuit in the disk is powered by selectively spinning the disk.

The measurement of the sample is performed on or in the disk.

The illustrated embodiment can thus also be characterized as a field portable diagnostic apparatus including: a rotatable disk with a center; a microfluidic circuit defined in the rotatable disk; a separation chamber receiving a sample, the separation chamber defined into the disk across a range of radial positions from the center of the disk so that centrifugal forces stratify the sample into components in the separation chamber when the disk is spun;

a magnetic bead holding reservoir defined into the disk; a mixing chamber defined into the disk communicated to the separation chamber and to the magnetic bead holding reservoir, where mass amplifying functionalized magnetic-nanoparticles, held in a buffer solution and contained in the magnetic bead holding reservoir communicated to mixing chamber, are mixed with the separated fluid delivered to mixing chamber from the separation chamber, the functionalized magnetic nanoparticles conjugating in the mixing chamber with a target analyte in the sample; a SAW chamber defined into the disk including a surface acoustic wave detector (SAW); a magnet in proximity to the SAW chamber to draw the functionalized magnetic nanoparticles toward antibodies immobilized on the SAW sensor surface; a flushing or wash reservoir defined into the disk communicated SAW sensor chamber; and a cleanup/waste reservoir defined into the disk communicated to the SAW chamber for receiving fluid after it has passed through the SAW chamber.

More generally, the illustrated embodiments include a handheld apparatus comprising a rotatable disk, a fluidic circuit defined into the disk for performing a diagnostic analysis of an analyte, a SAW detector communicated with the fluidic circuit, and control electronics communicated to the SAW detector for controlling operation of the rotatable disk, fluidic circuit and SAW detector to measure the presence and/or quantity of the analyte to make a diagnostic determination, wherein fluidic movement within the microfluidic circuit is performed by means of rotationally generated forces without pumping. In other words, the embodiment is a microfluidic circuit in a spinning disk with a diagnostic SAW detector.

In one embodiment the SAW detector is functionalized and selectively captures the analyte by processing the analyte in the fluidic circuit and the control electronics selectively operates the fluidic disk and SAW detector to dry measure the analyte in the SAW detector. In other words, the embodiment is a microfluidic circuit in a spinning disk with a diagnostic dry-measurement SAW detector.

In another embodiment the apparatus further includes a selectively activated source of magnetic force and wherein the microfluidic circuit includes selectively released magnetic nanoparticles selectively linkable to the analyte, the control electronics operating the microfluidic circuit to overcome limitations of fluidic diffusion of magnetic nanoparticles selectively linked to the analyte during selected phases of operation of the microfluidic circuit. In other words, the embodiment is a microfluidic circuit using magnetophoretic forces on magnetic nanoparticles in a spinning disk with a diagnostic SAW detector. In the illustrated embodiment all fluidic movement within the microfluidic circuit is performed by means of rotationally generated forces without pumping.

In yet another embodiment the SAW detector is functionalized and selectively captures the analyte by processing the analyte in the fluidic circuit and the control electronics selectively operates the microfluidic circuit and SAW detector to dry measure the analyte in the SAW detector.

In one embodiment the apparatus further includes a selectively activated source of magnetic force and the microfluidic circuit includes selectively released magnetic nanoparticles selectively linkable to the analyte. The control electronics operates the microfluidic circuit to overcome limitations of fluidic diffusion of magnetic nanoparticles selectively linked to the analyte during selected phases of operation of the microfluidic circuit.

The illustrated embodiments of the invention include a system for performing a portable, fast, field assay of a small sample biological analyte having a microfluidic disk used with an electronic smart reader device.

The scope of the invention includes a method for operating each of the above described apparatus to make a label free, field portable diagnostic test. The apparatus and method is capable of limits of detection in the pictogram range, typically 10 picograms or less in a 1-10 ml sample. In the extreme limit, depending on ligand biochemistry employed in the reader, single molecule or single viral detection is possible.

The various embodiments can be visualized by referring to the following drawings wherein like elements are denoted by like reference numerals.

BRIEF DESCRIPTIONS OF THE DRAWINGS

FIG. 7 is a table of the sequence of spin steps to which the disk is subjected.

FIGS. 18A and 18B are diagrams showing two methods of passive valving.

FIGS. 20A and 20B are side see-through and side cross sectional views respective showing the structure of another embodiment of the blood plasma separation cone wherein a directly loaded, enlarged, three dimensional separation chamber is provided mounted on top of the disk.

DETAILED DESCRIPTION OF THE PREFERRED EMBODIMENTS

Lab-on-Disk (LoaD) Devices

Figure 1:
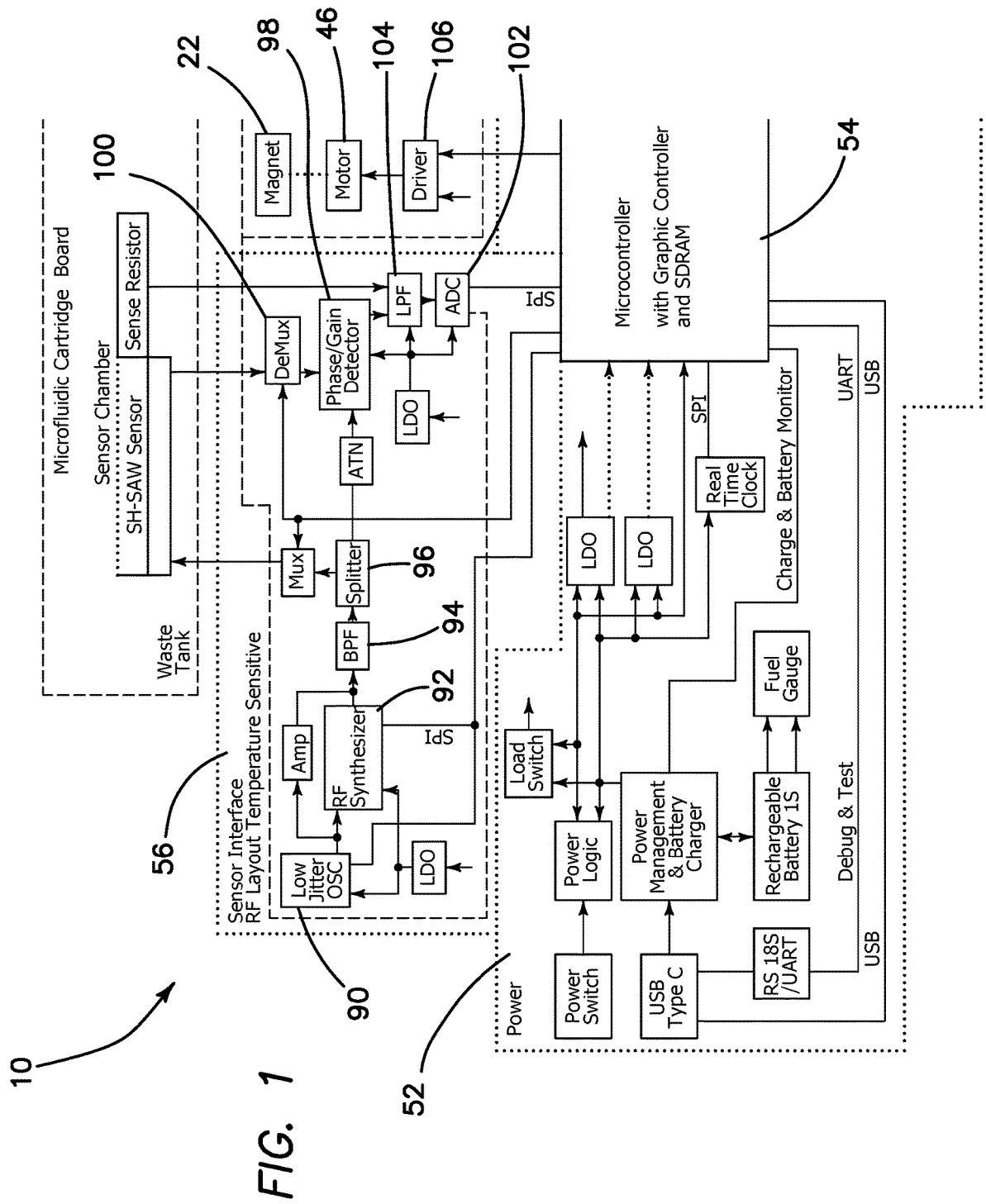
FIG. 1 is a block diagram of the electronic components for controlling the microfluidic cartridge.
Figure 1:
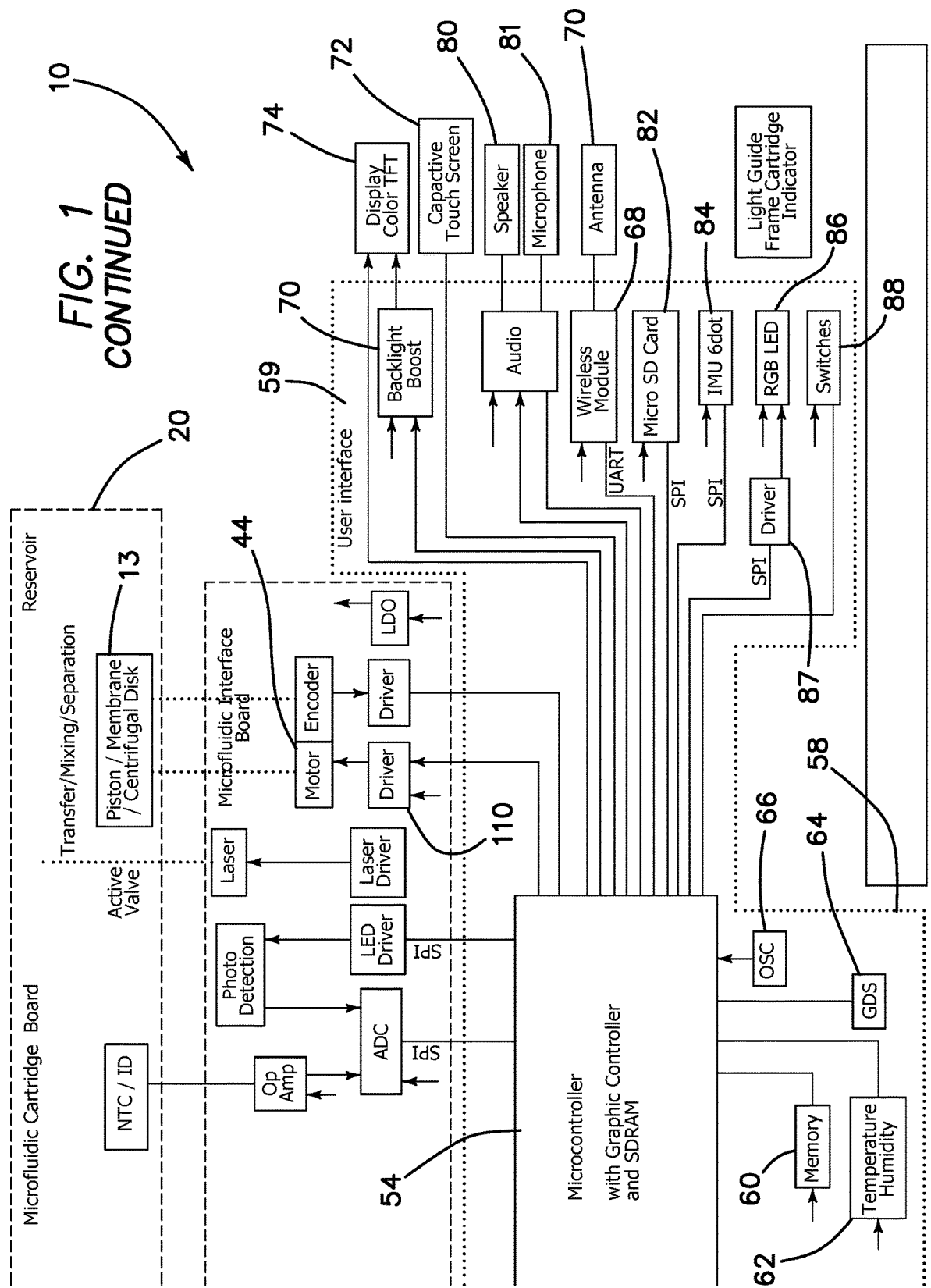

LoaD devices have a particular importance in the application of personal diagnostics handheld readers. The illustrated embodiments mainly focus on DNA analysis and human disease diagnostics but are not limited thereto. The illustrated LoaD modality has been designed from the ground up to be readily used in different areas such as in diagnostics, bioanalysis, and biosensing for environmental monitoring including testing of water and food pathogens, for testing of drugs, in pharmaceutic monitoring, and for applications not yet known. It has the advantage of low power consumption, portability, modularity, reconfigurability, and automates the laboratory processes like sample transport, dispensing and mixing, reducing the time and prerequisite necessities of laboratory tests.

SAW Sensor, Microfluidics and "lab-on-a-disk"

Solving the technical challenges of such apparatus to be realized as a handheld, label free device without the preparatory steps customarily conducted in a laboratory setting are resolved by an understanding of the internal physical, biological and chemical principles that govern such complex diagnostic processing as disclosed below.

While contemplating the entire biochemical reaction between an analyte and its specific antibody or antibody fragment, we must answer a set of questions which fundamentally and inherently define the process. This involves the rate of hybridization (the association and dissociation of the chemical process K+/K−, the effect of the diffusion coefficient (D), the flow characteristics of the buffer with its associated biological agent (Navier-Stocks Equation), the physical principles governing the sensing modality (florescent, PCR, ELISA, SPR, optical, resistive, capacitive etc.), and the entire biochemical process and its time duration. The challenges that need to be addressed to employ the illustrated biosensor are mixing, separation, transfer, conjugation and clean up.

In traditional chemical assay procedures done in a laboratory, all of these steps are done separately and require distinct equipment. The concept of Lab-on-a-disk integrates the separate steps into a singular, self-contained fluidic module that is capable of using the rotational forces associated with a spinning disk 13 to perform all of the necessary steps outlined above to make a measurement.

Love Wave, Sheer Horizontal Surface Acoustic Wave Biosensor

In the illustrated embodiment a class of acoustic sensors 38, generally known as a Love Wave-sheer horizontal surface acoustic wave (SH-SAW) biosensor, is the detector type selected for development. It must be understood that other types of sensors could be employed without departing from the spirit and scope of the invention. The SH SAW biosensor 38 was selected for its ability to resolve small mass accumulations over the sensing lanes or SAW channels 40 and to detect biological species with mass accumulation on the order of picograms ($10^{-12}$ g) to femtograms ($10^{-15}$ g). The biosensor 38 is intended to be deployed in a field setting, where the operator inserts a fluid sample, such as saliva, blood, urine or any combination of biological specimen, without the customary use of laboratory environment. The system 10 performs the entire biochemical test sequences in an automated basis using a "Lab-on-a-disk" modality. The system 10 is self-analyzing and transmits the test results wirelessly to the cloud for further use and therapeutic response by the local or remote physician, institution and data collection protocol.

The system 10 utilizes interactive algorithms to analyze data while employing artificial intelligence (AI) routines, so that the complex variabilities of human disease conditions are sorted based on background data, nested as parametric discriminators in a form of a "Look-Up-Tables". Sorting is performed using statistical measures as: genders, age, geographical location, ethnicity and other relevant medical input parameters to narrow the Gaussian errors associated with population variance.

The aim of "diagnostic on the fly" means that the system 10 is capable of overcoming the biophysical limited time scales during which the test is conducted (the diagnostic test should be performed within about 10 minutes of sample introduction). The system 10 acts as "lab-on-a-disk" and performs the necessary steps of separating the complex assay of blood, saliva, urine or and body fluids into its components (gross separation) in separation chamber 14, then the reduced assay is physically delivered to a mixing chamber 16, a method for amplification of the analyte in question is then performed using magnetic nanoparticles 180 to form a complex, and the combined immunoassay 190 complex is transferred to a SAW sensing chamber 26.

It has been determined according to the illustrated embodiments of the invention that magnetic nanoparticles 180 that are provided with a dense core provide a response in a SAW detector comparable to a gold nanoparticle, whereas magnetic nanoparticles 180 which have a more evenly distributed mass do not. For example, aggregated $Fe_3O_4$ parallelepiped nanocrystals forming a dense core in a particle with a crosslinked hydroxyethyl starch coating result in a SAW signal similar to 10 nm gold nanoparticles. In contrast 500 nm Nanomag CLD fluorescent magnetic nanoparticles having $Fe_3O_4$ crystallites dispersed in a dextran matrix did not produce a phase shift in the same SAW detector comparable to the 100 nm BNF Starch MNP's and 10 nm AuNPs.

Detection

The detection limit (LOD) is an essential element of the biomolecular assay and sensor development. The pressure to push the detection limit of bioanalytical techniques to lower levels, while increasing resolution, is largely driven by a demand for new molecular diagnostic tests for early stage cancer detection and diagnosis. At early stages of cancer development, the amount of cancer biomarker molecules released from the tumor to the blood or other biological fluids is very small. Naturally, one assumes that a more sensitive analytical technique that can "catch" these biomarkers at lower concentrations will allow diseases to be detected earlier. Under this general premise, pursuing lower level detection limits has become a major goal of new bioanalytical technology development, particularly in this application where the use of a biomass, having a specificity to a predetermined analyte, employs a mass amplifier using orthogonal antibody fragments to respond to the analyte, thereby increasing its detectable mass proportional to the analyte bound to its antibody in the form of a traditional EUSA sandwich. It is not uncommon to see detection limits in the fg-pg $ml^{-1}$ range for protein antigens, and sometimes even down to the single molecule level.

While pursuing bioanalytical techniques and products with higher sensitivities and lower detection limits, it's important to ask a critical question: is the claimed/expected detection limit theoretically achievable? If by theory, an analytical method cannot possibly achieve the sensitivity as claimed, attempted use of such methods for expected high sensitivity analysis can only lead to a frustration of research effort and resources, and sometimes, misleading results. The issue of limited available biological specimen defined by its concentration (within the acquis volume) and the ability of the detector to sense such limited presence of the antigen is determined by the test apparatus resolution. These and other considerations limit our ability to measure concentration of biological species at the pg-ng $ml^{-1}$ order.

Detecting biochemical species with LOD ranging from femtogram to picogram values is mandated by the needs of early detection of biological species (biomarkers present in blood, saliva, urine or other bodily fluids), where such species are invariably marked by their low concentration value ($C_{minimum}$). Through experimentation, it has been discovered that the limit of detection (LOD) of the SH-SAW sensor is roughly on the order of one picogram. This arises from the frequency used (375 MHz) in the SAW sensor such that resolution is maximized, but elastic energy does not escape the lanes and interfere with detection. For a measurement to be deemed statistically significant by the National Institute of Standards and Technology (NIST), a signal value must be three times stronger than any background noise that is present on the device. The LOD arising from the relationship as set forth by the National Institute for Standards, (NIST), whereby the operational frequency (e.g. 325 MHz) and the phase shift of the signal as detected by the embodiment of employing a surface acoustic wave sensor, is thereby reduced to the following equation:

$$LOD=(3\times N_f/S\sigma\phi\times\phi 0)\Delta\sigma_r=3\times N_f/(S\sigma\phi\times\phi 0).$$

Where $N_f$ is the operational frequency, $S^\Phi_\sigma$ is the sensitivity of the device with reference to phase and standard deviation, $\sigma_r$ is standard deviation of the reference signal, $\phi$ is the phase measurement obtained from the surface acoustic wave sensor, $\phi_0$ is unmodulated phase (reference), $\Delta\sigma_r$ is the spread of acceptable standard deviation as imposed by the NIST (Signal must be 3× above the background noise).

Diffusion Coefficient (D) and Fluidic Transport

The major limitation arising from the requirement for a short testing time (10 minutes) is the limits of diffusivity. Diffusivity or the diffusion coefficient, is a proportionality constant of the flux of a concentration (such as a test analyte) due to its molecular properties over the gradient in the concentration of the species (the driving force for diffusion). Diffusion limits the speed at which analyte can fall out of suspension onto the sensor surface. Left unperturbed by the device, the mass amplifiers could take hours to fully diffuse thorough the fluid sample and interact with the target analyte. Hence, an initial step is a mixing event to homogenize the sample and the buffer. There are many ways to provide this function, such as through microfluidic recirculation to continually perturb the concentration gradient and induce mixing in the fluidic pathway, or using external forces on the sample, such as by using an electromagnet to agitate magnetic nanoparticles, or by having a motorized stirring component.

The system 10 is specifically engineered to the analytes in the fluid motion and their behavior. The Navier-Stokes Equations are a set of conservation equations that dictate the behavior of fluid motion. By simultaneously solving both for conservation of momentum and mass, the behavior of the fluid flow can be obtained. For a Newtonian fluid, the momentum conservation is expressed as:

$$\rho(\partial u/\partial t + u \cdot \nabla u) = -\nabla p + \nabla \cdot (\mu(\nabla u + (\nabla u)^T) - \tfrac{2}{3}\mu(\nabla \cdot u)I) + F,$$

Where $\rho$ is the density of the fluid, u is the velocity vector of the fluid, t is time, p is pressure, $\mu$ is the fluid viscosity, T is temperature, I is the inertial force of the fluid, and F are externally applied forces.

While the conservation of mass is expressed as:

$$\partial \rho/\partial t + \nabla \cdot (\rho u) = 0$$

For the momentum equation above, the terms represent (1) inertial forces, (2) pressure forces, (3) viscous forces, and (4) external forces. For application in microfluidic flow modeling, a second principle must be introduced to reduce the equation so that it can numerically be computed and utilized in the design stage of development. The Reynolds number, Re, is a dimensionless number that expresses the ratio of 1) inertial forces to 2) viscous forces. It can be calculated from the equation:

$$Re = \rho u L/\mu$$

where $\rho$ is the fluid density (kgm$^3$), u is the fluid velocity (m/s), L is the characteristic linear dimension of the application (m), and $\mu$ is the dynamic viscosity (Pa·s). For Re<1, viscous forces dominate, and the flow is laminar. For this application, the computed Re is low. Therefore, for the Navier-Stoke fluid transport equation for this application, the inertial term (1) and external forces (4) are neglected, except during mixing, where the Euler inertial force is used for efficient conjugation between magnetic nanoparticles 180 and blood plasma. Additionally, the incompressible nature of the fluid at application velocities means that the velocity gradient term is also neglected. The combined Navier-Stoke equation for laminar regime therefore reduces to $$0 = -\nabla p + \nabla \cdot (\mu(\nabla u + (\nabla u)^T)) \text{ and } \partial \rho/\partial t + \nabla \cdot (\rho u) = 0.$$

This system of equations, coupled with the boundary conditions arising from the geometry of the apparatus, is used to numerically solve for both a pressure and velocity field within the microfluidic circuit. As a result, any analytes that pass within 1 μm of the chip 42 are associated onto the functionalized surface of a sensing lane 40. This repetitive looping combined with Euler mixing results in an increase in the statistical odds of the analyte samples encountering an antibody. Because of this, the diffusion coefficient term of the convection diffusion equation at the removal site R can be neglected, as the scales in which convection are able to deliver analytes are much faster than diffusion such that diffusion becomes negligible.

There exists a tool to be utilized in quantifying the effects of mass transport through convection and diffusion. The Péclet number (Pe), is a dimensionless number which expresses the ratio of contributions of mass transport via convection and diffusion:

$$Pe = N_{conv}/N_{diff} = c_i |u|/D\nabla c_i = L U/D.$$

As the Reynolds number describes contributions to momentum transport, the Péclet number expresses contributions to mass transport across a characteristic length scale L. The Péclet number is solved for and found to be virtually zero. Because the Péclet number is much less than one, the mass will primarily be transported via diffusion from the fluid onto the chip 42 at the length scale of analyte-antibody interaction. This is incorporated into the greater flow model concept by a virtual increase in the diffusion coefficient through homogenization before the fluid reaches the sensor 38 via a mixing site in chamber 16 in the microfluidic disk 13. By decreasing the characteristic length scale of diffusion even further at mixing sites in chamber 16, an increased concentration gradient arises which leads to the occurrence of mixing by diffusion, but at greatly reduced time scales. Although the antigens are deposited via diffusion onto the chip 42, the convective mixing helps to replenish the lower layers by mechanical homogenization and prevents a concentration gradient from developing that would impede sensor saturation timelines. Because of the electrochemical attraction that exists between an antibody and antigen, there exists a range in the fluid flow for which spontaneous capture is likely to occur. As a result, homogenization allows for quicker sample saturation as with each pass the lower layers are refreshed and do not have to act on diffusion time scales to replenish the layers at which capture can occur.

Conjugation Between Analyte and Antibody—the Association Rate

There exists an intrinsic association rate $K \equiv k_{on}/k_{off}$ that dictates the capture rate of analytes to the fragmented antibody layer. This property is intrinsic to the covalent reaction between the analyte and its receptor antibody. Although the electronic affinity for capture between a single antibody and its target analyte cannot be altered through biochemical techniques, it can be virtually increased through several different geometrical applications. One such application is the increase in the total number of available antibody capture sites. By increasing the capture site density on the sensor 38, a virtual increase is created in the association rate between antibody and analyte, as spontaneous capture is inherently more likely to occur as the number of available binding sites increase. Simultaneously, advances in biochemical laboratory techniques allow for the packing density of single chain fragment variable (scFv) antibodies onto the surface with greater preferential directionality.

The antibody fragments we choose for our sensor and mass amplifiers are designed to have a high affinity for binding to a particular analyte while possessing a mass much greater than the analyte to be more readily detectable by the SAW sensor 38. Additionally, antibody fragments possess a vectorial affinity and rigidity that works to support the strategy of mass amplification regarding the surface acoustic wave sensing modality. By employing mass amplifiers, a three-piece sandwich ELISA is created, including an antibody capture site welded to the sensor, a target antigen captured from the fluid sample, and a mass enhancing particle, such as a gold magnetic nanoparticle 180 or a magnetic bead. Because a single mass amplifier has a mass thousands of times greater than the target antigen, this EUSA binding process allows us to detect target materials that would otherwise be undeletable because of the LOD of the device.

The addition of mass loading to the SAW sensor 38 during shear wave propagation enables a detectable phase shift in the acoustic waveform to be observed because of the attenuation of the surface shear waves in response to the additional mass. This correlates directly to the ratio of analyte surface coverage of the SAW sensor 38 at equilibrium to total available surface sites as explained below. This final solid-state phase shift is registered electronically by a reader mechanism which uses a microprocessor 54 to analyze the data and store or transmit the results to the user be it the physician or the institution.

Given an antibody-antigen reaction that follows an adsorption pattern according to the Langmuir Isotherm, the surface adsorption process is be expressed as:

$$[\text{Antibody}]+[\text{Analyte}] \Leftrightarrow [\text{Antibody-Analyte complex}],$$

or $[Ab]+[S] \Leftrightarrow [AbS]$

With forward reaction constant $k_{on}$ and reverse reaction constant $k_{off}$. The adsorption can be described using the differential equation:

$$d\Gamma/dx = D(\partial C/\partial x)$$

where C is concentration; D=Diffusion Constant (cm$^2$/s), Where $\Gamma$≡Surface coverage (molecules/cm$^2$), and the equilibrium constant:

$$K \equiv k_{on}/k_{off} = \Gamma/(\Gamma\text{max}-\Gamma)C_b; \Gamma\text{equilibrium} = \Gamma\text{max}KC_b$$

where $\Gamma$max is the total number of available antibody binding sites on the surface of the detector, $k_{on}$ is the antibody association rate, $k_{off}$ is the antibody disassociation rate, and $C_b$ is the concentration of the analyte. The kinetics can be related to the rate of diffusion in the solution by $$J_D = \text{Rate of diffusion} = D(\Delta C)/L,$$

Where $\Delta C$ is the concentration gradient of the suspended particles, L is the diffusion length and the simple Langmuir first-order rate of adsorption (for low coverage) at the surface, $J_R$:$J_R = k_{ads}C_S(\Gamma\text{max}-\Gamma)$, where $k_{ads}$ is the equilibrium constant. When using the SAW biosensor 38, the endpoint is typically used i.e. when the system reaches an apparent steady-state (the delta phase value levels off). At steady-state:

$$JD = JR \therefore D(Cb-Cs)L = kadsCs(\Gamma\text{max}-\Gamma)$$

solving for the surface concentration at steady state:

$$C_S = C_b/(1+k_{ads}L(\Gamma\text{max}-\Gamma)D), \text{ or } C_S = C_b(1+\theta),$$

where $\theta$ is known as the Thiele modulus, a dimensionless parameter. For cases where the value of $\theta \gg 1$, $C_s$ approaches 0, and any antigen contacting the surface will be absorbed onto it. In this case, the rate of surface coverage is determined by the rate of diffusion in solution or:

$$JD = D(C_b - C_S)L.$$

For cases where $\theta \ll 1$; $C_s$ approaches $C_b$. Therefore, the diffusion in the solution is faster than the adsorption and the kinetics of the process is governed by the rate of adsorption at the surface. In this case:

$$JR = k_{ads}L(\Gamma\text{max}-\Gamma)$$

When not in a limiting case, the equation for $C_s$ is solved. Based on literature values, the value of $\theta$ is calculated to be $2 \times 10^{-9}$; $\theta \ll 1$. Assuming a diffusion constant D given by the Stokes-Einstein equation gives:

$$D = k_b T/6\pi\eta r \approx 5 \times 10^{-7}$$

where $k_b$ is the Boltzmann constant, and $\eta$ is the dynamic viscosity. The packing density of the antibodies nanoparticles 180 in the immunoassay 190 assay is estimated at $10^{10}$ molecules/cm$^2$. Therefore, the rate of change of the surface coverage can be given by an adsorbing species is given by the simplified equation:

$$d\Gamma/dt = k_{ads}C(\Gamma\text{max}-\Gamma).$$

Since all experiments are performed at approximately the same temperature (temperature-controlled disk 13), assume that $k_{ads}$ a remains constant Integrating with initial conditions:

$$\Gamma(0)=0; \Gamma(t)=\Gamma,$$

the solution becomes:

$$\Gamma = \Gamma ma(1-e^{k_{ads}c_b t}), \text{ or } \Gamma/\Gamma\text{max} = 1-e^{k_{ads}c_b t}.$$

The time constant which determines the relaxation time for each run, $\tau$, is given as $T=1k_{ads}c_b$. The $\Gamma/\Gamma$max is directly proportional to the corrected, normalized phase change. Therefore, the correlated values:

$$\Gamma/\Gamma\text{max} = \text{delta phase(sample)/delta phase standard (glycerol)} = 1-e^{(-t/T)}.$$

The signal is assumed to reach saturation at the end of $3\tau$, which corresponds to 95% of the delta phase value. This is estimated to be less than 10 minutes. The delta phase values depend on both the concentration of the antigen and the incubation time. The transient is assumed to typically last less than 10 min, but is dependent and the antigen antibody combination.

Shear Horizontal SAW CHIP

Elevated troponin levels generally indicate heart damage unless proven otherwise. It's presence in the blood indicates heart failure, and a sudden spike in troponin levels indicates a heart attack. When the heart muscle tissue is damaged, it releases the protein troponin into the blood stream. Typically, when a patient is admitted into an emergency care unit complaining about chest pains, a sample of blood is drawn and sent to the lab for troponin level analysis. If a sample came back above a reference value, additional further tests were administered. The problem with the current system is with the laboratory turnaround time. Currently in the developed world, clinical and laboratory turnaround times in troponin T testing to be about 122 minutes from admittance to diagnostic of a heart attack. This includes drawing the sample, transport to the laboratory, prepping the sample for testing, and the actual tests which themselves take over an hour to complete.

The illustrated rapid biosensor system 10 performs a diagnostic test, where instead of a lengthy process during which the heart continues to be damaged during the entirety of the laboratory process, a sample is taken and in 10 minutes doctors would know to start treatment. The sample can be drawn in an ambulance, and the SAW testing occurs during the transport to the hospital. Patients are unloaded from an ambulance with a laboratory diagnosis of their troponin levels to indicate whether immediate treatment for heart failure should be administered. Such an embodiment shows the power of fast, portable biosensing. No longer is the device limited to the regime of preventative medicine or diagnostics but can also be used as a lifesaving emergency device.

The main property of a SAW sensor 38 is that it attenuates or shifts the phase of a waveform. There are variables that determine this phase shift, such as the material, lane length, but one dependent variable is mass. Any loading on the waveguide layer, through pressure changes associated with mass, causes a distinct phase shift in a wave that traverses the medium. In fact, many of the commercial telecommunications SAW filter properties are generated by depositing varying layers of thin films to weigh down the waveguide layer to attenuate the signal based on the application needs.

The illustrated SAW sensor 38 has adequate shielding such that it can be used not only in open air, but in fluids without shorting or crosstalk across the liquid medium. A SAW surface or sensing lanes 40, functionalized with an antibody layer, traps any target analytes in a fluid sample. As the antibody sites fill up, the addition of mass onto the SAW detector 38 results in a detectible phase shift. This leads to some further probing SAW's as a potentially new field of biosensing. Early results, although promising, required concentrations of antigens much higher than of any practical usage. Two problems exist with other attempts to successfully utilize the SAW detector 38 as a biosensor. Initially, the trials lacked any form of amplification, or the addition of mass to a target analyte such that it can be more readily detected. Even the most precise of SAW sensors 38 have an intrinsic limit of detection, or minimum mass required, that arises from the target frequency used. Too low of a frequency would result in a massive limit of detection and an unusable result. Too high of a frequency causes the vibrations to bleed into the other sensing lanes 40 causing interference, as the walls that separate each channel or lane 40 become invisible to the high energy waveforms. The addition of a mass amplification step resolves the issue of a limit of detection but requires additional biology in the detection step in the form of mass amplifiers, as well as a complex microfluidic apparatus that can deliver said mass amplifiers without returning any false positives.

Illustrated Embodiments

Figure 9:
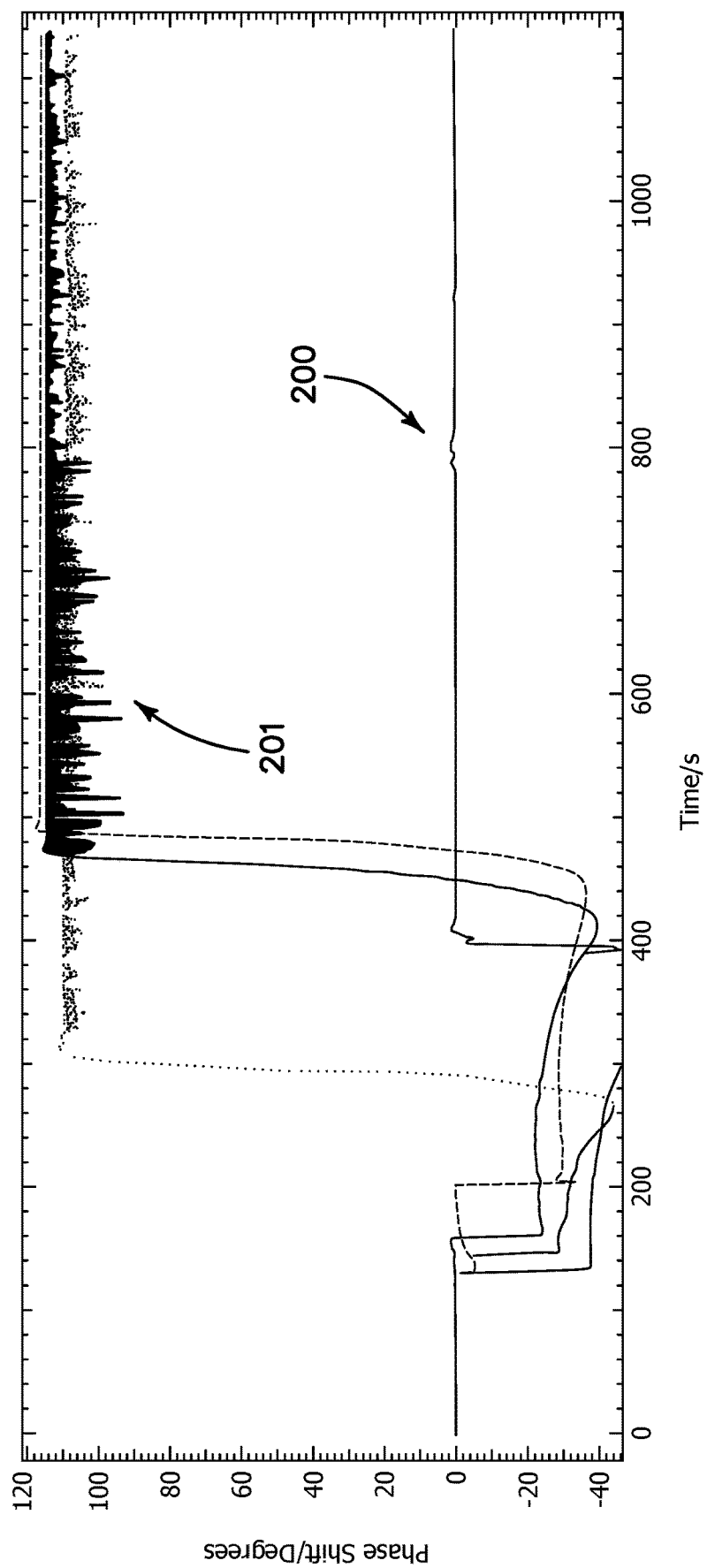
FIG. 9 is a graph of the data aquired from a measurement using the reader as disclosed.
Figure 12:
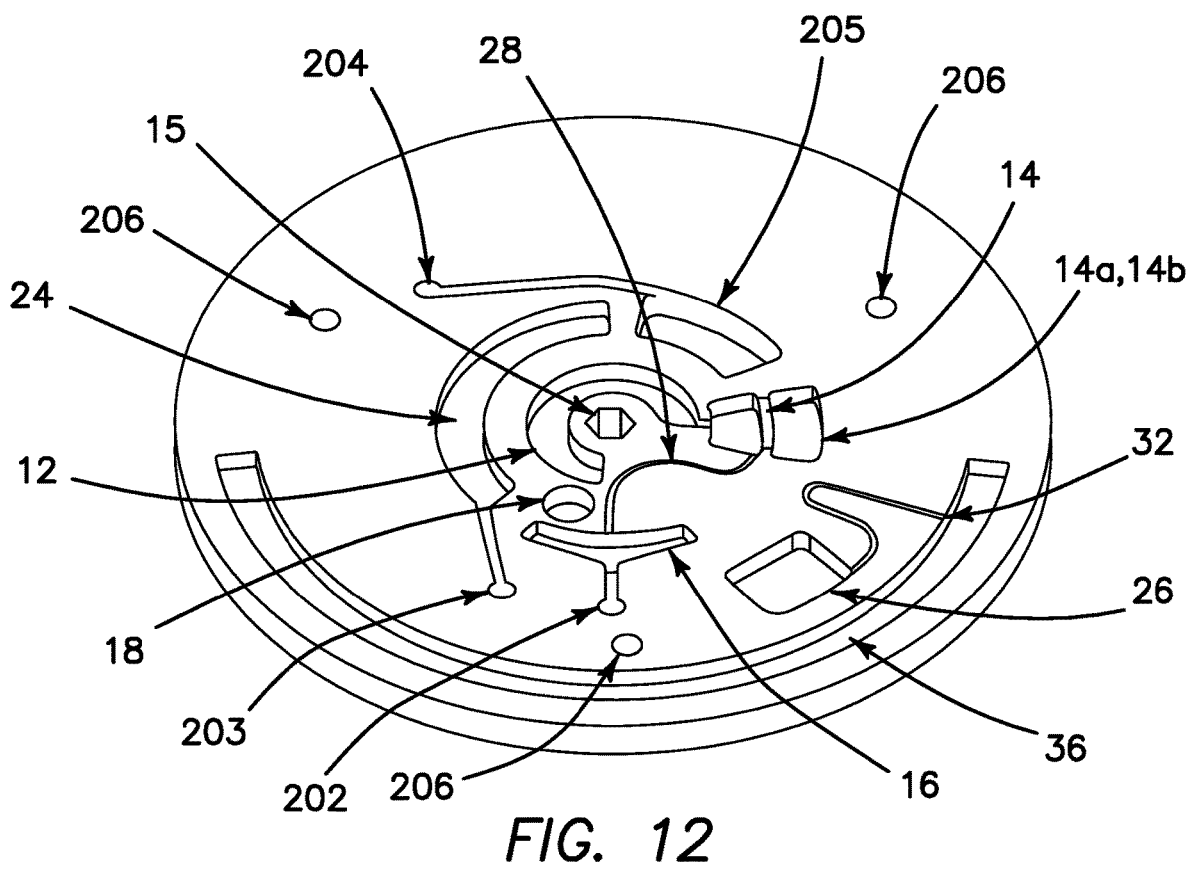
FIG. 12 Is a perspective view of the top of the embodiment of FIG. 11.

A system 10 includes a closed microfluidic circuit inserted into a reader 20 having circuitry as shown schematically in FIG. 1. Details of the circuitry and modules of FIG. 1 will not fully be described again here, but can be found in the applications incorporated above, which are herein inserted by reference in their entirety. The closed microfluidic circuit of the system 10 includes at least the following elements defined in or included in a rotatable disk 13 with a spindle hole 15 shown in top plan view in FIG. 2 and in perspective view in FIG. 3:

a. Disk 13 is sealed on its top and bottom surfaces by clear, featureless plastic layers 207 and 209 in FIG. 16.

b. A self-healing septum (not shown) provides positive closure of sample inlet and reservoir 12 of the closed microfluidic circuit of system 10 while allowing insertion of a patient's sample or analyte, typically by means of a syringe. The sample inlet and sample reservoir 12 sealed by the septum for holding an initial patient sampled.

c. A blood-plasma separation chamber 14 is communicated to sample reservoir 12 where centrifugal forces are applied to stratify a sample.

d. A mixing chamber 16 is communicated to blood-plasma separation chamber 14 through siphon 28, whereby mass amplifying functionalized magnetic-nanoparticles, either held in a buffer solution and contained in a magnetic bead holding reservoir 18, are communicated to mixing chamber 16 or lyophilized in the mixing chamber 16, and are mixed with the blood plasma delivered to mixing chamber 16 from chamber 14.

e. The magnetic bead holding reservoir 18 contains functionalized magnetic nanoparticles 180 that are either suspended in a buffer solution or lyophilized.

f. A phosphate buffered saline solution (PBS) in flushing reservoir 24 is communicated to SAW sensor chamber 26 through laser valve 203 in FIG. 12, which reservoir 24 contains a pure PBS solution that is released into the SAW chamber 26 containing the conjugated magnetic nanoparticles 180.

g. A second PBS or deionized (DI) water, flushing reservoir 201 shown in another embodiment in FIG. 12 is communicated to SAW sensor chamber 26 through laser valve 204, which reservoir 201 contains either a PBS solution or DI water that is released into the SAW sensor chamber 26 containing conjugated magnetic nanoparticles 180.

h. A SAW sensor chamber 26 is communicated to mixing chamber 16 through laser valve 202 in FIG. 12, in which chamber 16 is the sensor surface of the surface acoustic wave detector (SAW) 38 as shown in FIG. 9.

i. A cleanup/waste reservoir 36 is provided for holding all fluid after it has passed from the SAW sensor chamber 26 and through siphon 32 and for receiving through siphon 30 any of the contents of mixing chamber 16 not delivered to SAW chamber 26.

Figure 2:
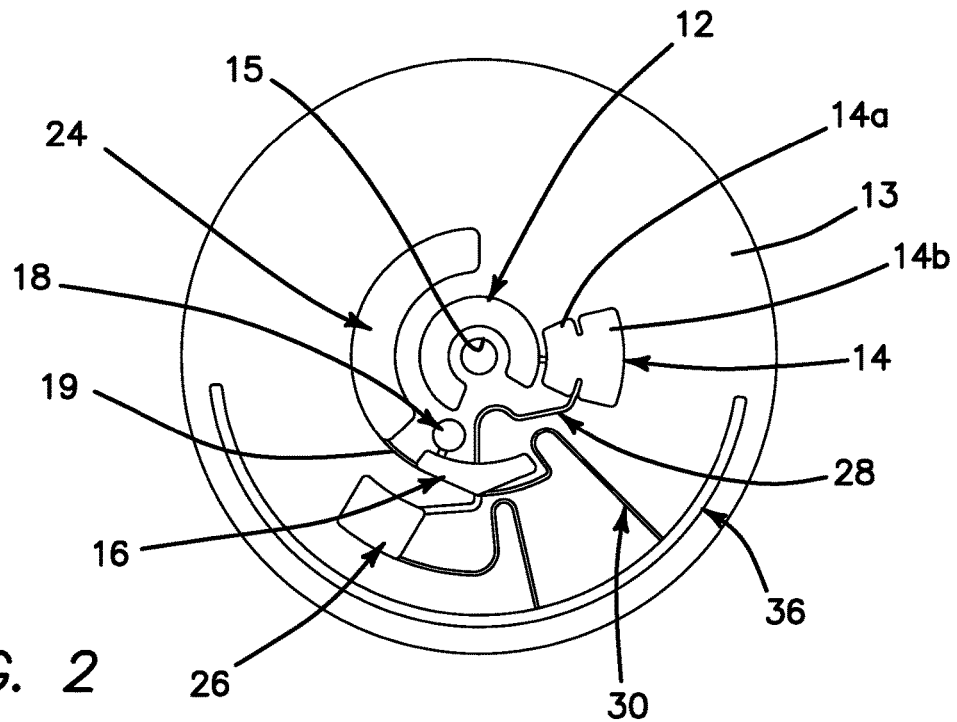
FIG. 2 is a top plan view of the microfluidic disk and the chambers and channels defined therein of a first embodiment of the microfluidic circuit in the disk in which a single wash reservoir is provided.
Figure 13:
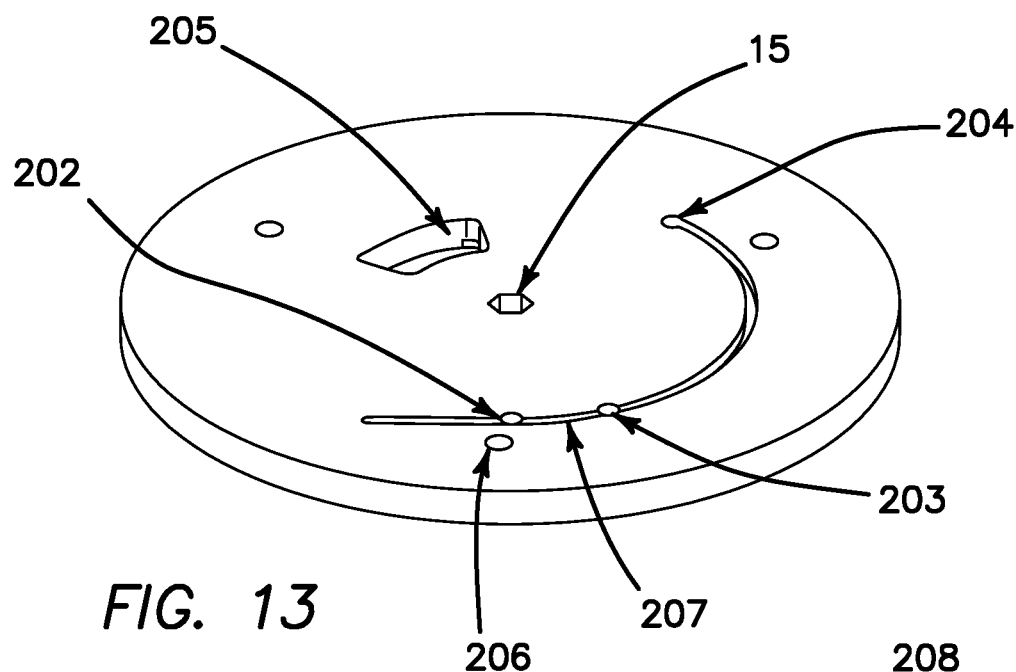
FIG. 13 is a perspective view of the bottom of the microfluidic disk and reservoir components of FIG. 12 shown the laser valving locations in a back channel.

A sample is introduced to the sample reservoir 12 in FIG. 2, and the disk 13 is placed in the reader 20. The disk 13 is spun, and the centrifugal force drives the fluid from the sample reservoir 12 to the blood plasma separation chamber 14. Alignment of the various layers comprising disk 13 is facilitated by three symmetrically defined alignment holes 206 into which an assembly jig is temporarily placed. The disk RPM is increased to allow for blood separation to occur, after which point the plasma is transferred via siphon 28 to the mixing chamber 16. Flow can be controlled by laser-melting valves (shown in FIG. 12) or passive valves (shown in FIGS. 19A-19D) and described below. By increasing the centrifugal force, channel 19 is opened to the magnetic bead reservoir 18 and magnetic bead buffer and magnetic nanoparticles 180 mix with the blood plasma in mixing chamber 16. A sloshing effect created by Euler forces during oscillation of the disk 13 homogenizes the blood plasma with the magnetic bead buffer. A plastic or steel disk (not shown) may be inserted into the mixing chamber 16 to further enhance mixing. A 1 W blue laser 156 then opens the laser valve 202 as seen in FIG. 12 and allows the mixed fluid to flow into the SAW chamber 26, where the magnetic nanoparticles 180 conjugate onto the surface of the SAW sensor 38. Laser valves 203, 202 and 204 on the outlets of PBS wash reservoir 24, mixing chamber 16, and DI wash reservoir 205 respectively are communicated by through-holes defined through disk 13 to channels or siphons on the underside of disk 13 communicating with SAW chamber 26. FIG. 13 is a perspective view of the bottom of disk 13 showing a single back channel 207 communicating PBS mixing chamber 16, wash reservoir 24, and DI wash reservoir 205 in which corresponding laser valves 202, 203 and 204 respectively are disposed. As better shown in FIGS. 19A-19*d* back channel 207 is fluidly clear or unblocked and is selectively tapped by activating laser valves 202, 203 and 204. A magnet is placed under the SAW sensor 38 to draw magnetic nanoparticles 180 toward the surface of the SAW sensor 38. After enough time has passed, the laser 156 opens a laser valve to siphon 32 and the sample is allowed to drain from the SAW chamber 26. Laser valve 203 is opened in FIG. 12 and the PBS wash reservoir 24 releases the PBS buffer that initially washes the SAW surface, removing any nonspecifically bound particles, and transports the fluid to the waste reservoir 36. The PBS/DI water reservoir 201 releases the PBS/DI water to do a second wash of the SAW surface through laser valve 204, removing the rest of the nonspecifically bound particles and salts and transports fluid to the waste reservoir 36 via siphon 32.

Figure 3:
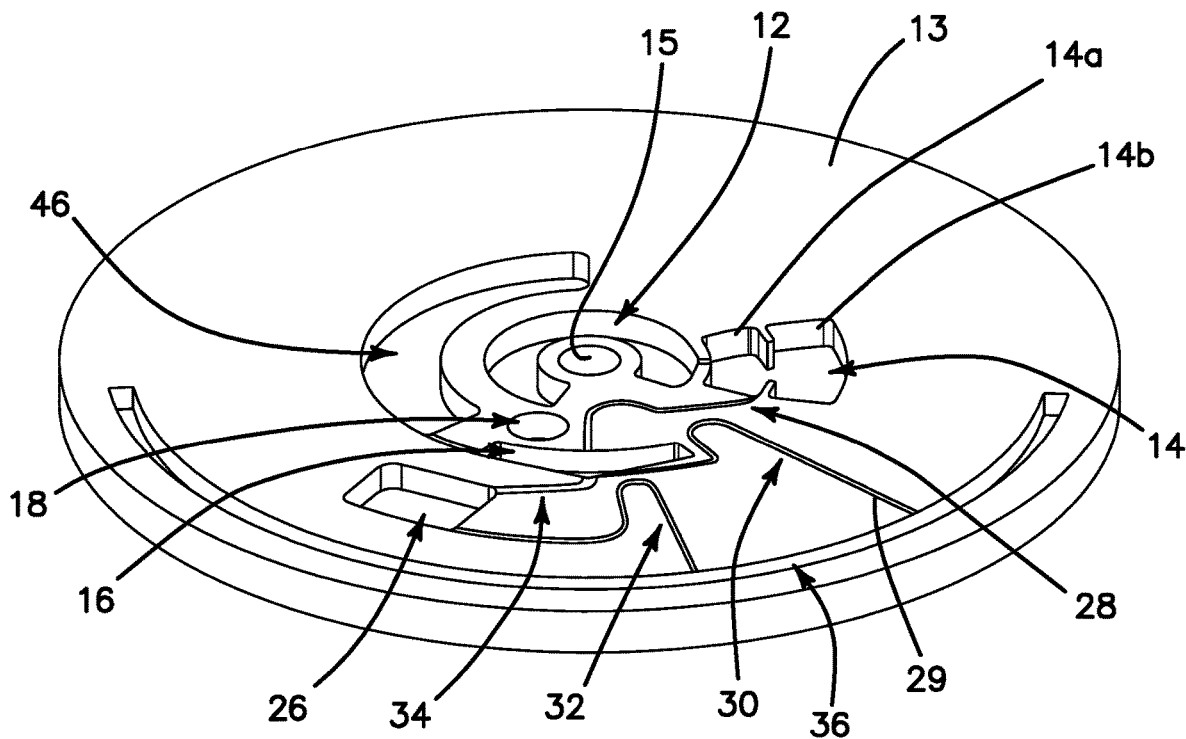
FIG. 3 is a perspective view of the disk of FIG. 2.
Figure 16:
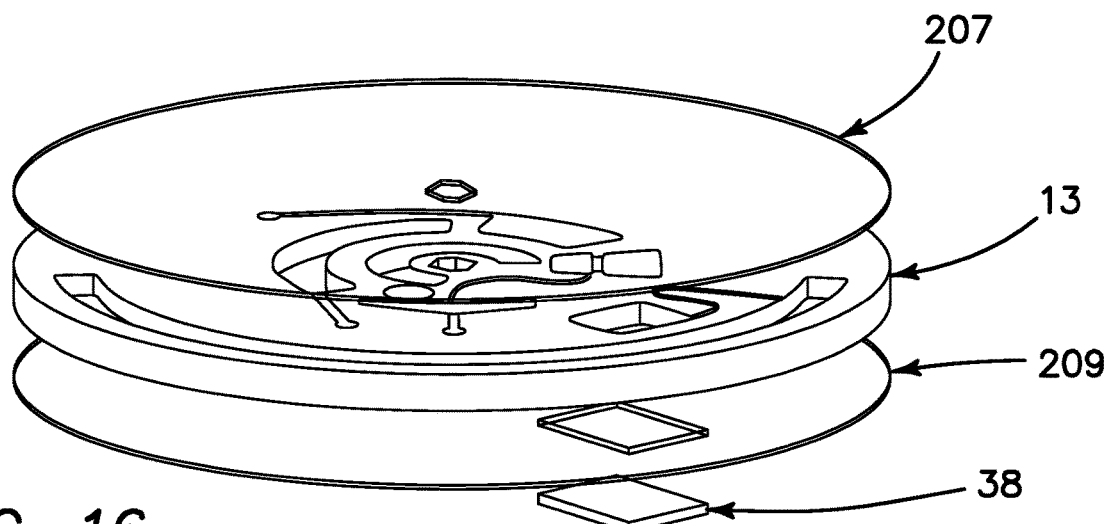
FIG. 16 is an exploded perspective view of the disk showing the various microfluidic disk layers and the hydrophobic tape layerings forming a three-layer sandwich.

The various siphons, reservoirs and chambers depicted in disk 13 in FIGS. 2 and 3 are defined into disk 13 by any means now known or later devised in disk 13 of any appropriate material, e.g. by molding, which is the illustrated embodiment is defined into a disk 5-10 mm thick composed of polymer composition. A cover or sealing layers 207, 209, shown in FIG. 16, is disposed over the top and bottom of disk 13, thereby providing a fluid-tight closure for the various siphons, reservoirs and chambers, which then comprise closed elements with sample reservoir 12, as previously discussed, provided with a penetrable membrane covering allowing syringe access through any cover or sealing.

Figure 10:
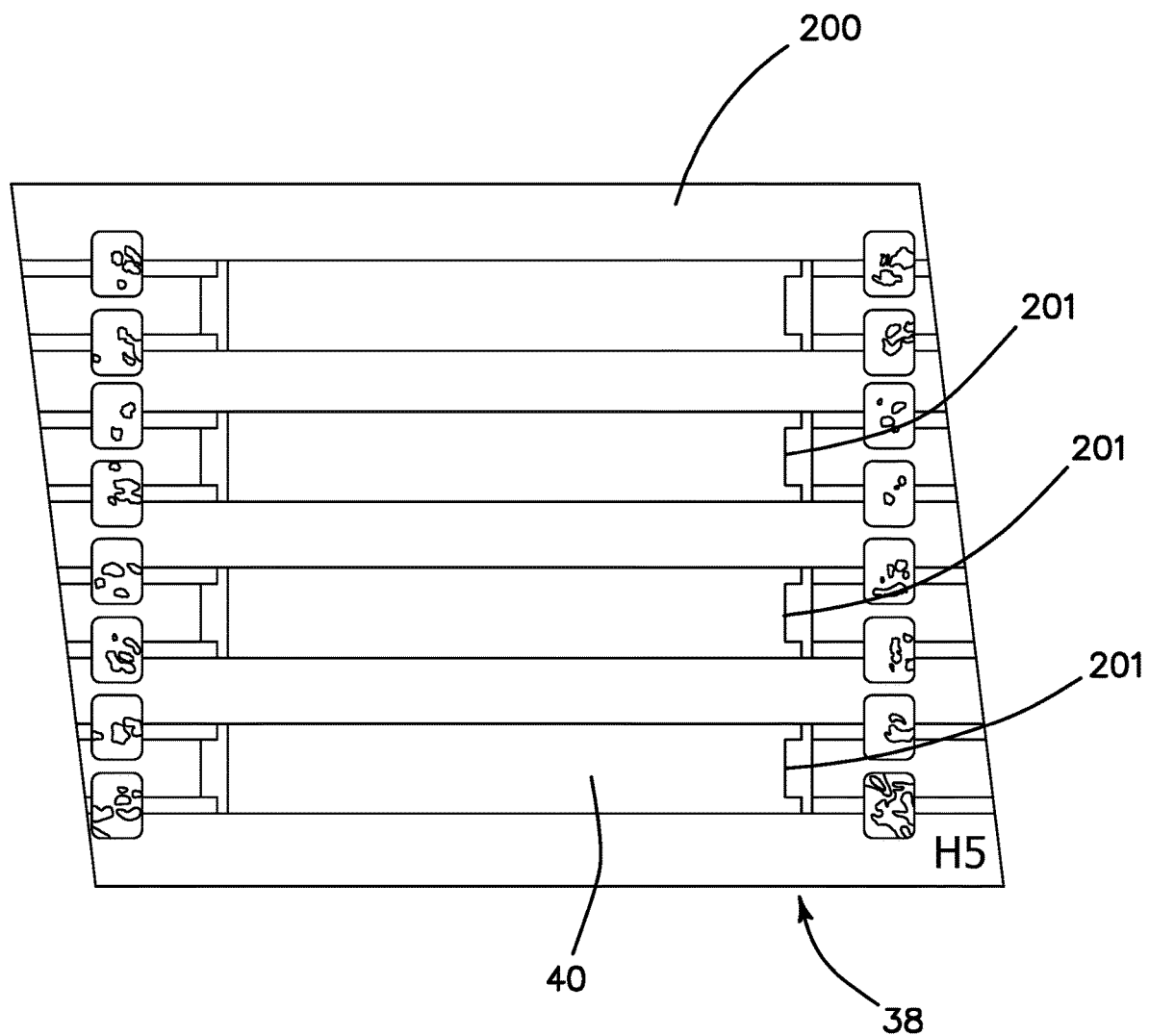
FIG. 10 is a top plan photographic view of a dried SAW chip after conjugation has occurred.

In one embodiment the plurality of channels 40 in the SAW detector 38 in FIG. 10 include one reference lane 200 and three functionalized sensing lanes 201, with each lane being functionalized to a different target allowing for the multiplexing of testing targets on a single chip 42.
Reader In one embodiment, the system 10 includes a spindle motor 44 diagrammatically shown in FIG. 1 for diving the disk 13, and an attached hexagonal chuck 48 shown in FIG. 6 for securing the disk 13. The system 10 also includes a magnet 22 and RF sockets 150 mounted on interposer 148, which is raised or lowered by a cam (not shown) driven by z-axis motor 46 as shown diagrammatically in FIG. 1.

In one embodiment the system 10 further includes a power module 52 shown in FIG. 1 coupled to a microcontroller 54 and SAW interface module 56 for providing electrical power to the same.

In one embodiment the system 10 further includes peripherals module 58 coupled to the microcontroller 54 including a memory 60, a temperature sensor/a humidity sensor 62, a GPS module 64, a real time clock 66, a cooling fan (not shown), and an in-circuit serial programming (ICSP) logic module (not shown) included on board microprocessor 54 for firmware programming.

In one embodiment the user interface 59 includes a Wi-Fi module 68 and antenna 70 coupled to the Wi-Fi module 68, a capacitive touch screen 72, a color thin-film transistor display 74 and a graphic controller (not shown) included in microprocessor 54 with memory 60 coupled to the thin-film transistor display 74 with a backlight source 76.

In one embodiment the user interface 59 includes an audio module 78 with a speaker 80 and microphone 81 coupled thereto, a serial data card interface 82, an inertial motion unit 84, at least one RGB LED 86 with driver 87, and at least one program switch 88.

In one embodiment the SAW interface circuit 56 includes a low jitter clock oscillator 90, an RF synthesizer 92 coupled to the clock oscillator 90, a low pass or bandpass filter 94 and splitter 96 having an input coupled to the RF synthesizer 92 and an output coupled to the SAW detector 38, a phase/gain detector 98 coupled to the low pass filter 94 and splitter 96 and having a data input communicated with the SAW detector 38 through a demultiplexer 100, an analog-to-digital converter 102 having an input coupled to an output of the phase/gain detector 98 through low pass filter 104 and having an output coupled to the microcontroller 54. A driver 106 is coupled to microcontroller 54 to drive Z motor 46. A motor driver 110 is controlled by microprocessor 54 and coupled to disk motor 44 for mechanically driving the disk 13 shown in FIGS. 2 and 3.

The illustrated embodiments also are directed to a microfluidic cartridge for use with a system for performing a portable, fast, field assay of a small sample biological analyte apart from the system. The microfluidic cartridge includes a closed microfluidic circuit for mixing and recirculating the analyte with a buffer; and a shear horizontal surface acoustic wave (SAW) detector communicated with the microfluidic circuit and having a plurality of channels including at least one functionalized sensing lane in which the mixed analyte and buffer is recirculated and sensed and including at least one reference lane in which the mixed analyte and buffer is recirculated.

The microfluidic cartridge is characterized by a closed microfluidic circuit which includes a microfluidic chamber where the analyte and buffer are combined, an active mixer coupled to the microfluidic chamber for mixing the analyte and buffer into a homogenous mixture, a one-way check valve coupled to the microfluidic chamber and/or active mixer, a pump coupled to the one-way check valve for providing for a positive pressure of the mixture in the closed microfluidic circuit, a bubble trap coupled to the microfluidic chamber and/or active mixer for removing air bubbles from the mixture, a passive mixer coupled to the bubble trap for providing for a uniform flow of the mixture, a distributing manifold coupled to the passive mixer for uniformly distributing the mixture into the plurality of channels in the SAW detector, a receiving manifold for collecting the mixture after flow through the SAW detector, and a return line for recirculating the mixture to the microfluidic chamber.

The reader 20 also contains a spindle motor 44 that is capable of driving a 17 mm microfluidic disk 13 that, when bearing a fluid sample, weighs approximately 13 grams. In order for the more complex fluidic modules to function, such as mixing and filtration, the motor 44 needs to be sufficiently large such that the motor is capable of imparting 1000 $\frac{rotations}{{second}^{\hat{}}}$ of rotational acceleration to the disk 13 and should have a chuck 48 locking mechanism.

The reader 20 will also include laser diodes 156 that will be used to melt away a portion of the 154 located in passive valves to allow for buffer fluids to be released into the fluidic circuit as necessitated by the staging priorities.

The illustrated embodiment also contemplates an apparatus or system 10 in combination with a smart device or phone (not shown) which is capable of communicating with an internet connected network or cloud (not shown). The apparatus or system 10 performs a portable, fast, field assay of a small sample biological analyte and includes: a closed microfluidic disk 13 with fluidic circuit shown in FIGS. 2 and 3, a functionalized SAW sensor 38, a microcontroller 54 coupled to detector 38 for controlling the detector 38 and for data processing an output assay signal from the detector 38; and a user interface 58 communicated with the microcontroller 54 for providing user input and for providing user output through the smart device to the network.

In another embodiment, a step of performing magnetically actuated conjugation uses either an electromagnet or a permanent magnet 22. The magnetic field magnitude e.g. 0.5 Tesla, is used in the current embodiment, but other values are contemplated as expressly being within the scope of the invention where the magnetic field strength is based on geometrical parameters associated with the microfluidic device. In the event of a permanent magnet 22, due to the inverse square law nature of a magnetic field strength, the field strength rapidly falls off with the distance. The permanent magnet 22 is able to travel far enough away from the microfluidic disk 13 such that the magnetic field strength is comparable to the background magnetism, for example 500 Gauss. This allows for the device to vary the magnetic field on the microfluidic circuit using microprocessor control of the magnet's position.

Microfluidic Sequencing

Figure 8:
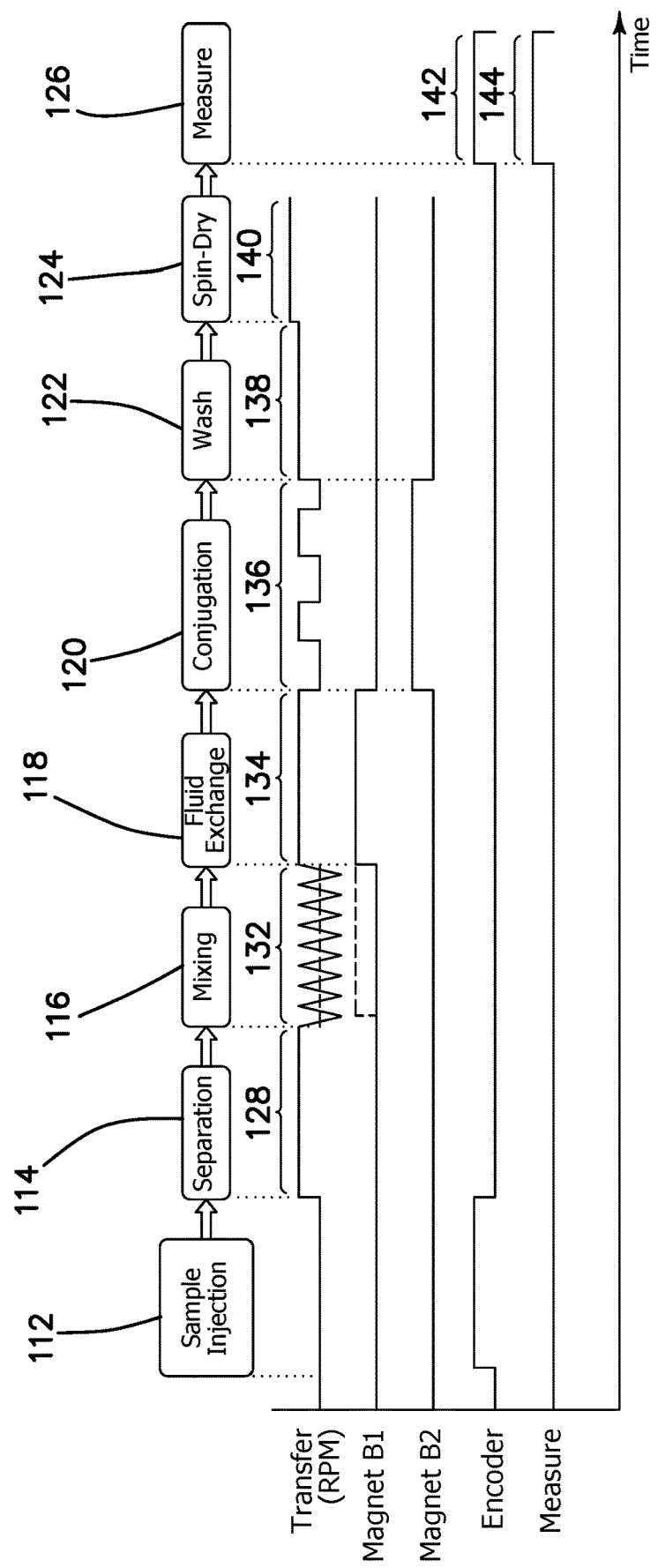
FIG. 8 is a schematic timing diagram of the microfluidic sequence needed for measurement.
Figure 11:
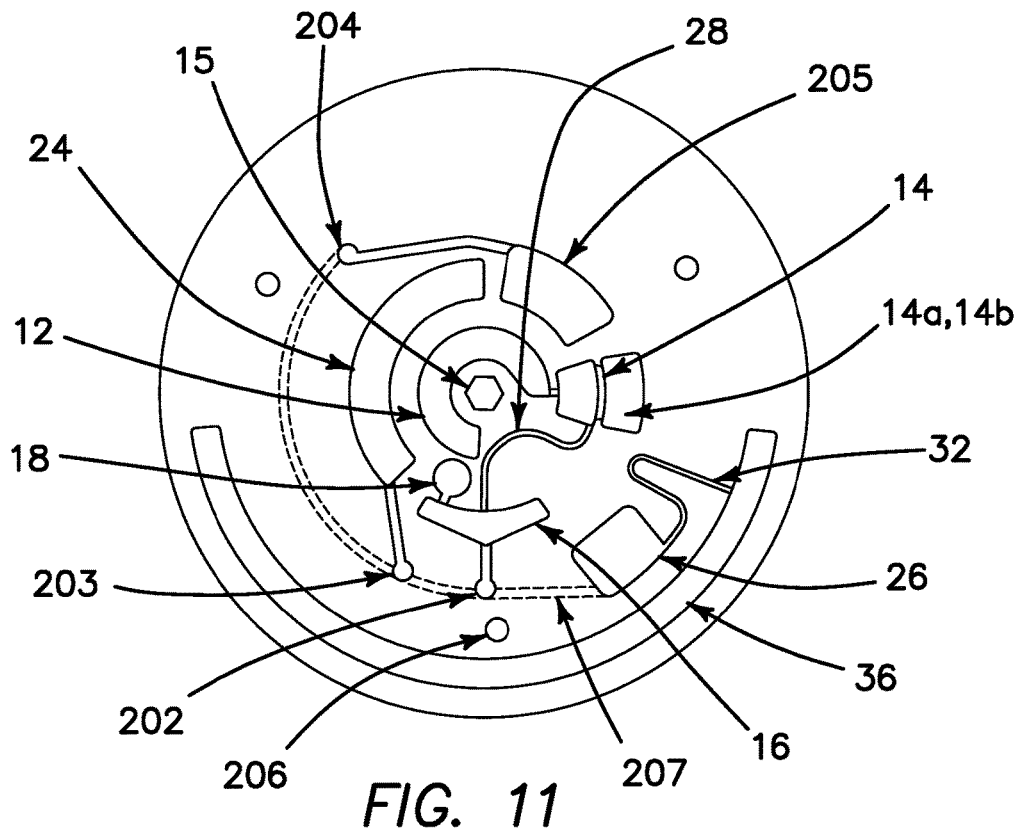
FIG. 11 is a top plan view of the microfluidic disk in a second embodiment in which two wash reservoirs are provided.

FIG. 8 is a timing diagram showing the operative steps and order required for a measurement to be taken by the SAW microfluidic disk 13. After the sample is injected at sample injection step 112, the separation step 114 occurs in the blood plasma separation chamber 14. The sample is transferred through the microfluidic circuit during the separation step 114, where the fluid is filtered in chamber 14 and the whole blood is separated from the target analyte. The fluid is transferred to the mixing chamber 16, where PBS nanoparticles 180 are released from the magnetic bead reservoir 18, if not already present or delivered to mixing chamber 16, and mixed with the sample in mixing step 116. Following thorough mixing between plasma and magnetic nanoparticles 180 as facilitated by oscillations 132, magnet 22 is brought into effective range (Magnet B1) and magnetic nanoparticles 180 are magnetically affixed to chamber wall 16. The plasma is thus removed and transferred directly to waste chamber 36 through siphon 29 as shown in FIG. 3. The plasma is replaced by a PBS buffer from PBS reservoir 46. Laser valve 202 is opened and the mixture is transferred by pulsed spinning of disk 13 in the conjugation step 120 to the SAW sensor chamber 26 with the magnet force applied (Magnet B2) to SAW chamber 26 to overcome diffusion and to assist in capture of magnetic nanoparticles to the functionalized sensing lanes 201. After a sufficient conjugation time, the buffer is removed, and a pure PBS sample from reservoir 24 is flowed over the SAW sensor 38 in the wash step 122 and in the embodiment where a second DI water wash reservoir 205 is provided as shown in FIGS. 11 and 12, a second wash is provided in step 122. All fluid is removed from the functionalized sensing lanes 201 during the spin-dry step 124, and after completion of the drying, SAW chamber 26 is positioned over and coupled to RF sockets 150 in positioning interval 142 and one or a plurality of measurements are taken and recorded in interval 144 in the measure step 126 with disk 13 stationary and the magnetic field off or withdrawn.

Figure 5:
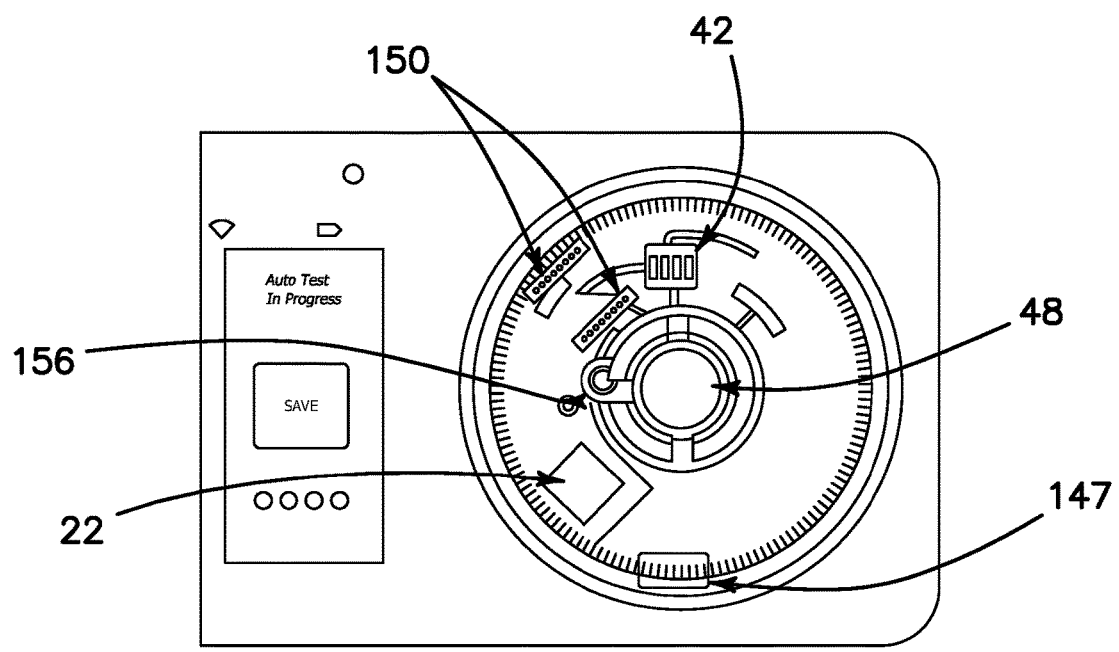
FIG. 5 is a top plan view of the reader with a disk loaded therein.

The sequencing required for the microfluidic disk 13 to make a measurement in the illustrated embodiment as shown in FIG. 7 are explained in more detail as follows. The first step 112 is to insert a blood sample through the septum of the cartridge 20, which stores the fluid in a collection or sample reservoir 12. Next, at step 114 the blood plasma is separated from the complex serum by using centrifugation performed by the spinning disk 13 which stratifies the sample by density. For example, during step 114 during interval 128 disk 13 is spun at 5000 to 6000 rpm for 1 to 5 minutes with separation chamber 14 being disposed between 10 to 20 mm radially from the center of disk 13. The plasma is transferred to a separate reservoir, so called mixing chamber 16, via a passive, siphon valve 130 . . . . The mixing chamber 16 is preloaded with magnetic nanopartides 180 coated with specific antibody for the target analyte from magnetic bead reservoir 18. Within the mixing chamber 16, rapid oscillation of the disk 13 at a frequency between 1-2 Hz and across an angular span of 300 degrees, during interval 132 homogenizes the plasma with the nanoparticles. Following mixing, laser valve 202 is opened by firing laser 156 for 1-3 seconds. The rotation speed is increased, transporting nanoparticle-plasma mixture is transported to the SAW detector 38 in packets, where an electromagnet 52 controlled by microprocessor 54 located under the sensor 38 draws the functionalized nanoparticles 180 to the SAW surface of lanes 40. The disk rotation will stop transfer to allow sufficient time for antibody-antigen binding to occur to immobilize the nanoparticles 180 during the conjugation step 120 during interval 136 for 30 seconds. The rotation of disk 13 may be repeatedly pulsed during interval 136 to assist in the repositioning of antibodies and antigens in detector 38. In the illustrated embodiment the duty cycle of disk rotation during interval 136 for up to 90 seconds may be in the range of 50 to 150%. After the entirety of the buffer solution has interacted with the SAW surfaces in lanes 40, laser valve 203 is opened and a PBS wash from reservoirs 24 and 16 is provided through the SAW detector 38 to remove any nonspecifically bound proteins and nanoparticles 180 during wash step 122 during interval 138 for 30 seconds. After the first wash, laser valve 204 is opened and the second wash, consisting of either PBS or DI water, is released from reservoir 201 to flow over the SAW sensor 38 during interval 138 for 30 seconds. The disk 13 is then rapidly rotated at 2000 to 5000 rpm during interval 140 of 60 seconds to "spin-dry" the SAW sensor surface to remove any PBS and excess liquid from the sensor surface. A dry measurement provides a substantially increased sensitivity readout from SAW sensor 38. Since the processing of the sample is performed in a wet fluidic circuit and the measurements made in a dry sensor, the methodology may be properly distinguished from conventional dry or gas SAW measurements as being a "dried measurement". An encoder 146 in FIG. 5 is used to find the precise location of the disk 13 and rotates it so that an RF interposer arm 148 can contact the flex printed circuit board PCB 151 (not shown) located on the underside of the disk 13 that provides power to the SAW sensor 38 while disk 13 is stopped in a precise position.

FIG. 7 is a table of the sequencing methodology employing the embodiment of FIGS. 11 and 12 providing an example of spin rates and times. The sequencing methodology is characterized in the table as comprising ten steps: 1) inserting the blood or sample in sample chamber 12 during an interval of approximately 0.5 min at 0 rpm; 2) spinning for about 1-3 min at about 5000 rpm to flow the sample to the blood-plasma separation chambers 14*a* and 14*b* wherein a sloping gradient is created to separate blood and plasma; 3) priming siphon 28 by first spinning at 500 rpm; 4) flowing the separated plasma to mixing chamber 16 where it is mixed with magnetic nanoparticles 180 for about 0.5 min by spinning at about 5000 rpm; 5) further mixing the magnetic nanoparticles 180 with the plasma by oscillating disk 13 through a 300° rotation at a 2 Hz rate for about 1-3 min. (other rotational magnitudes may be substituted as desired); 6) laser valve 202 is opened at 0 rpm and the plasma in mixing chamber 16 directly moved through a siphon to waste chamber 36 while the magnetic nanoparticles 180 are selectively, magnetically retained in mixing chamber 16 followed by magnetic release and flow of magnetic nanoparticles 180 with a PBS buffer into SAW chamber 26 by spinning at a linearly accelerating spin rate from 2000 to 5000 rpm at 500 rpm/s rate over about 0.5 min.; 7) the distribution of the magnetic nanoparticles 180 are homogenized and surface conjugation in the SAW chamber 26 performed by oscillating disk 13 through a 3000 rotation at a 2 Hz rate for about 5-20 min.; 8) siphon 32 is primed by spinning at 500 rpm and the contents of SAW chamber 26 is transferred to waste reservoir 36 by spinning at 2000 rpm for about 0.5 min.; 9) SAW chamber 36 is then washed with PBS from wash reservoir 24 by opening laser valve 203 and by DI from DI wash reservoir 205 by opening laser valve 204 and spinning at 2000 rpm for about 2 min.; and 10) SAW chamber 26 is then spun dry at 3000 rpm for about 2 min and a dry measurement is made of the bound analyte at 0 rpm. The entire diagnostic method thus takes about 13-32 min to perform. It is to be expressly understood that other spin rates and times could be employed without departing from the scope or spirit of the invention.

Centrifugal Blood Plasma Separation

The separation of blood cells from blood plasma is an initial step in the microfluidic sequence and allows for a much less complex serum to be probed (plasma). Blood cells can interfere with the nanoparticle 180 conjugation and can attach nonspecifically to the biosensor and foul results. Traditionally, blood plasma separation occurs outside of a sensor device in a laboratory, typically in a centrifuge, and is transferred to an assay measurement device. In order to automate and compartmentalize detection, separation needs to be incorporated into the disk 13. Centrifugal microfluidic separation platforms offer automation, miniaturization, and integrate seamlessly into the many other benefits found in the Lab on a Disk modality, such as transfer. By exploiting the density difference between red and white blood cells and blood plasma, we use induced sedimentation that arises from the centrifugal force applied on the body of the fluid to rapidly separate the plasma for collection and transport it downstream to various further modules.

The physics of phase separation in a microfluidic centrifuge can be expressed by the force felt on a particle $F_v = (2\pi v)^2 z_p V_p (\rho_p - \rho_1)$, where $V_p$, is the volume of a particle, $z_p$ is the radial position of the particle, and $v$ is the rotational frequency.

Particles of mass density $\rho_p$ falling short of liquid mass density $\rho_1$ are driven radially inward while the denser particles settle outwards. When a particle with radius r_p drifts in liquid medium with viscosity $\eta$ at velocity u_d, the Stokes drag friction force felt by the particle of $\rho_p$ becomes $F_s = -6\pi \eta_1 r_p u_d$. Combining the two forces acting on a particle, the constant drift velocity of a particle becomes $u_{drift} = s_p z_p (2\pi v)^2$, where the sedimentation coefficient $s_p$ is expressed as $$s_p = \frac{m_p}{6\pi \eta_1 r_1} \left(1 - \frac{\rho_1}{\rho_p}\right).$$

From this set of equations we see that the particle sedimentation is strongly dependent on the particle diameter (blood cell), radial position and angular velocity. The shorter distance the particle must travel, the lower this time takes.

Figure 14:
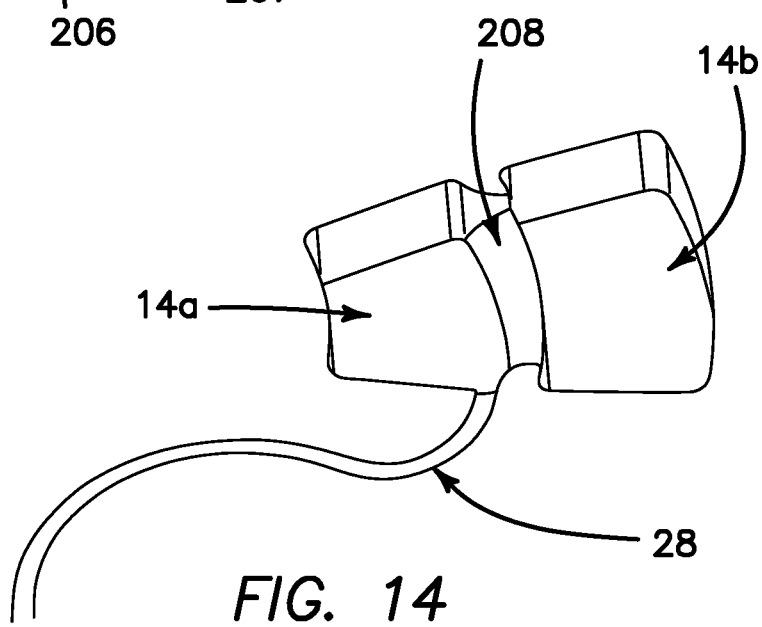
FIG. 14 is a perspective view of the blood plasma seperation chamber shown in isolation of the disk in which it is defined.
Figure 15:
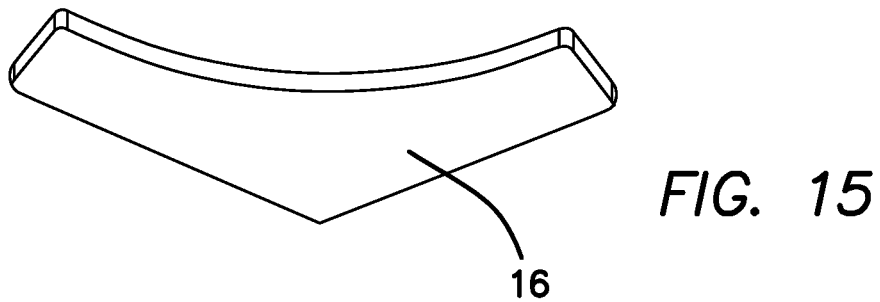
FIG. 15 is a perspective view of the mixing chamber shown in isolation of the disk in which it is defined.

Implementing these theoretical boundary conditions our design, as shown in FIGS. 2 and 3 the radial dimension of centrifugal separation chamber 14 has been minimized and expanded in the tangential direction of the disk 13 to reduce centrifugation timescales. For timely and optimal separation, and to prevent hemolysis, the centrifugal force is kept between 500-2000 g. Chamber 14 is comprised of an inner portion 14a in which the serum accumulates and an outer portion 14b in which the heavier blood cells accumulate, typically under high-g forces greater than 500 g. A gradated channel, sloping radially outward, connects the inner and outer portions 14a, 14b respectively of the chamber 14. The direction of the slope, shown in more detail in FIG. 14 includes a gradient step 208 between portions 14a and 14b allows for easy sedimentation of red blood cells to portion 14b under high-g forces and prevents the red blood cells from returning to portion 14a during deceleration of the disk 13 due to Euler forces. Siphon 28 connects to the radial most portion of inner portion 14a to preferentially draw the cell-free serum from separation chamber 14 to mixing chamber 16 at low g-forces typically less than 5 g. Siphon 32 communicates with the bottom of portion 14a so that only plasma is transferred to mixing chamber 16.

In those cases where an increase sample size must be accommodated separation chamber 14A, 148 of the above described embodiments can be replaced by the enlarged three-dimensional separation chamber 14 of FIGS. 20A and 20B. Conical chamber 14 is disposed axially on disk 13 and is azimuthally symmetric. A septum covered sample inlet 230 is defined through the center upper conical surface of the outer slanted cone 231. A sample receiving volume is defined below outer cone 231 and is characterized by an axial or central inverted cone 232 in its lower planar surface in which an axial outlet 233 is defined. The blood sample is injected through the septum covered inlet 230 and as disk 13 is spun, the blood cells are centrifuged to the periphery of conical chamber 14. Blood plasma containing the analyte is separated out and remains in the radial central portion of chamber to be withdrawn through outlet 233 as described above.

Centripetal Fluid Transfer

Figure 17:
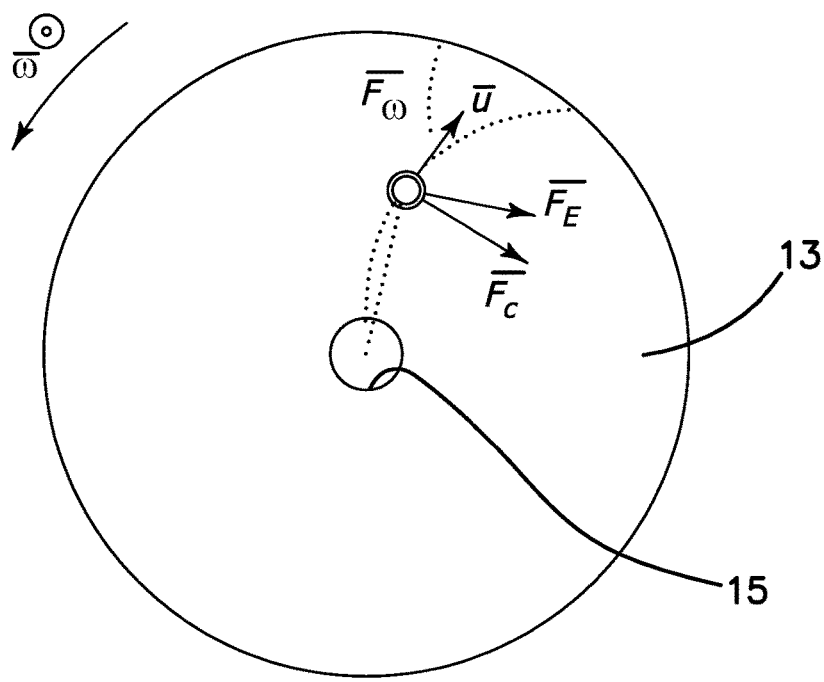
FIG. 17 is a diagram showing the centrifugal, coriolis and Euler forces acting on a particle in one of the disk chambers or channels.

The primary function of the microfluidic disk modality is to rapidly transfer the fluid through the microfluidic circuit to the various chambers that are required for the SAW detector 36 to take a valid measurement. The driving force acting on the fluids is the centrifugal force, which provides the centripetal acceleration in the rotation process radially outwards from the center of the disk 13 and is shown diagrammatically in FIG. 17. The centripetal force goes as follows:

$$f_{ce} = m\omega^2 r$$

where m is the mass of the particle or fluid, r is the radial distance from the center, and $\omega$ is the rotational frequency. The centripetal force acts as a unidirectional pump, driving fluid from the center to the outer edge of the disk 13. This force can be precisely controlled by varying the angular frequency of the disk 13 by changing the amount of power supplied to the electromotor 44 and varying the radial distance of the chamber or channel in question from the disk center. Chambers and channels milled into the disk 13 create barriers to fluid flow.

Passive valving can be achieved by balancing centrifugal and capillary forces, such as between sample chamber 12 and separation chamber 14. The simplest valve used is the capillary valve, shown in FIG. 18A, used to transfer fluid from an upper or radially inner reservoir 210 to a lower or radially outer chamber 212. The burst frequency at which capillary valve opens to allow fluid to flow from reservoir 210 to the lower reservoir is given by equating the centrifugal pressure at the exit of the capillary ($P_C$) and the surface-tension induced pressure ($P_S$):

$$P_C = \rho \omega^2 \bar{r} \Delta r$$

$$P_S = a\left(\frac{4\gamma}{D_h}\right) + b$$

where $\rho$ is the density of the liquid, $\omega$ is the angular velocity of the disk 13, $\bar{r}$ is the average distance of the liquid in the channel from the center of the disk 13, $\Delta r$ is the radial extent of the fluid subject to centrifugal force, $\gamma$ is the surface tension of the liquid, $D_h$ is the hydraulic diameter of the channel and a and b are empirical constants determined by the shape of the droplet and pressure required to wet the channel 216.

A second type of passive valve utilized in the microfluidic disk 13 is called a siphon valve, shown in FIG. 18B, and may be used to transfer plasma from chamber portion 14A to the mixing chamber 16 and to transfer the contents of the SAW chamber 26 to the waste chamber 36. At high speeds, the centrifugal force keeps the fluid below the crest 214 of the siphon 218, which represents an energy barrier. This valve relies on lowering the centrifugal force to allow capillary action to wick fluid into a hydrophilic channel and over the crest 214 of the siphon 218, when it can empty into the downstream chamber 212.

By utilizing the above two equations, and balancing centrifugal and capillary forces, we can program the logic of the microcontroller 54 to rotate at the requisite speeds for the fluid to complete its varying steps to separate the blood plasma, purify the sample and transport it to the sensor 38.

Magnetic Nanoparticle in an Immunoassay Sandwich Propulsion and Concentration.

The art of employing magnetic nanoparticles 180 for separation of a complex assay or biological species well-studied phenomenon. Shachar et. al, U.S. Pat. No. 8,684,010B2, describes a method by which the use of permanent magnets and alternatively electromagnetic coil are employed in manipulating paramagnetic nanoparticles 180 to drive and propel while concentrating the mass at a desired location relative to the magnetic flux line geometry and intensity of the source of the magnetic force. The patent describes the use of principles such as magnetic lensing techniques (Snell's Law as it applies to different dielectric and permeability values of the substance in question) as well as intelligent use of the inverse-square law of electromagnetics principles to achieve a specific position and/or concentration of the paramagnetic materials and any transition phases between such stages of magnetic and paramagnetic.

Use of the principles of magnetic force manipulation, the current application uses magnetic force to separate complex biological assays to a component whereby the desired species is then attached to a specific antibody whereby the magnetic nanoparticle 180 capture, through conjugation, the desired target and by further use of magnetic fields, the current apparatus is capable of separating and concentrating the specific payload so as to enable the measurement of the desired biological probe with the use of the surface acoustic wave sensor. For such application employing magnetic propulsion, an external magnetic field is applied to drive the separation of target entity (e.g. bacteria, viruses, parasites and cancer cells) from a complex raw sample in order to ease the subsequent task(s) for disease diagnosis. This separation process not only can be achieved via the utilization of high magnetic field gradient, but also, in most cases, low magnetic field gradient with magnitude less than 100 T*m² is equally feasible.

Fast, selective and accurate detection of diseases is critical in clinical diagnosis to allow physicians to provide more precise and preliminary medical assessments to patients. However, biological samples are usually exceptionally complex due to the presence of multiple components. In order to perform the disease diagnosis, it is essential to isolate the specific target entity (which is the infectious agent to be detected) from the complex raw material in the sample. This sample preparation step is needed prior to analysis in order to expedite the screening process. Through this process of magnetic selection, the diffusion coefficient factor described by Navier-Stokes formalism has been reduced to the significant element associated with the magnetic convection enhanced delivery.

Separation of a targeted entity for diagnostic purposes is possible through the application of magnetophoretic force. The idea implemented here is to magnetically isolate the target entity, either those with or without intrinsic magnetic responsive characteristic are attached to a magnetic nanoparticle 180 using an immunoassay 190 sandwich comprising of a magnetic nanoparticles 180, a functionalized antibody with target specificity, and the target in question forming a three-piece immunoassay 190. Due to the presence of magnetic field gradient, magnetic materials will be magnetically aligned and driven to the region with the highest magnetic field strength by magnetophoretic force. This phenomenon is known as magnetophoresis, which involves the motion of magnetic particles 180 relative to their non-magnetic surrounding medium under a non-homogeneous magnetic field.

The magnetic particles 180 coupled via an immunoassay 190 to a target in question with specificity is trapped and concentrated, and thereafter can be used for the measurement by the apparatus known in this application as a surface acoustic wave sensor, whereby the immobilized immunoassay sandwich on the surface of the sensor 38 is measured as a mass concentration and is reported back as a phase shift. Concurrently, the time consumed to separate target entity from a complex sample is one of the key factors that decides the duration of the diagnostic process.

As magnetophoretic attraction force experienced by a magnetic particle 180 is directly proportional to the magnetic field gradient, the magnetic particle 180 experiences a huge magnetophoretic force as it passes through the region adjacent to the magnetizable source:

$$F_m = 4/3\pi r^3 \mu_0 M \nabla H$$

Here, $F_m$ is magnetophoretic force exerted on single magnetic particle 180, r is radius of magnetic particle 180, $\mu_0$ is the permeability of free space, M is volumetric magnetization of magnetic particle 180 and $\nabla H$ is magnetic field gradient. Such a gigantic magnetophoretic force can overcome viscous drag and Brownian fluctuation which oppose the magnetophoretic motion of magnetic particles 180. Finally, the magnetic particles 180 will be captured on the surface of the fluidic channel above the magnetic source and isolated from the solution in a highly concentrated payload.

Viscous drag is the resistance encountered by an object that performs a relative motion with respect to the surrounding fluid. The magnitude of viscous drag can be evaluated by the Stokes equation:

$$F_d = 6\pi \eta r v$$

where $F_d$ is viscous drag experienced by magnetic particle 180. $\eta$ is viscosity of the suspending fluid and v is magnetophoretic velocity of magnetic particle 180 relative to fluid. The intensity of thermal fluctuation can be reflected by the magnitude of diffusion coefficient D of the given particle in the suspension as demonstrated in the Stokes-Einstein equation, which is assets based on the thermal energy, convection enhanced delivery and the diffusion coefficient.

Figure 22:
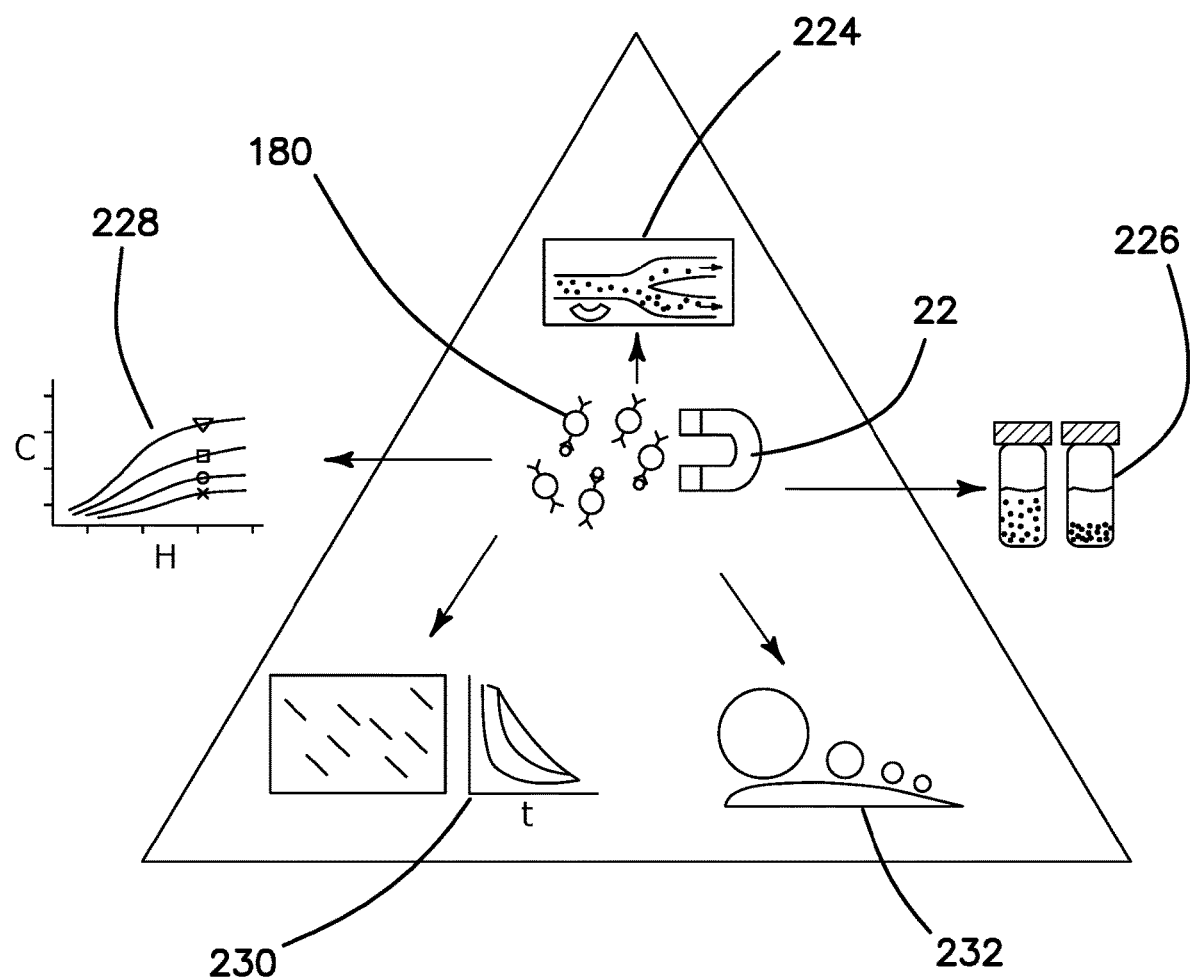
FIG. 22 is a schematic diagram demonstrating the relationship between the three major factors, namely particle size, particle concentration and magnetization, that influence the performance of magnetic nanoparticles in the microfluidic disk as used in transfer functions, concentration and magnetophoresis.

FIG. 22 is a schematic representation of the magnetic propulsion methodology employed by the apparatus. The diagram demonstrates the relationship between three major factors such as particle size, particle concentration in the assay, and the magnetization force intensity. This parameter influences the performance of a low gradient magnetic separation technique for the purpose of diagnostics as envisaged by the invention. A detailed study by the Royal Society of Chemistry (Working Principles and Applications of Magnetic Separation For Biomedical Diagnostics At High And Low Field Gradients, Leong et. al. 2016) shows that the parameters noted above are enabled by the use of optimized relationships between the magnetic field intensity, the particle size with their specific antibody, and the concentration of such magnetic nanoparticle 180 within the volume selected. The use of low gradient magnetic fields provides for separation within a complex assay such as blood and other bodily fluids so as to reduce the diffusion coefficient and enable conjugation based on the Kd value of the assay antibody analyte relationship while reducing the diffusion coefficient constant. Such techniques enable measurement by the proposed invention on a timescale of 5-15 minutes in contrast with such similar conditions whereby the defining timescale factor is associated with the diffusion coefficient. In addition, the ability to apply magnetic field to a paramagnetic particle and polarize them along the flux density line geometry provide for improvements of layering the magnetic nanoparticles 180 along an optimal sensor surface geometry. All the above are improvements proposed by the current embodiment.

Fluid Exchange Step and Magnetic Concentration

FIG. 22 is a diagram conceptually illustrating the various uses of magnetic forces in the illustrated embodiments on magnetic nanopartides 180 by magnet 22. Inset diagram 224 illustrates the use of magnetic forces to control the transfer of magnetic nanoparticles 180, such as by controlling movement direction among a plurality of diverging channels or selectively immobilizing magnetic nanopartides 180 during a fluid exchange or wash. Diffusion limitations are overcome by increasing the concentration of magnetic nanoparticles 180 using the magnetophoretic force as suggested by inset graph 228 of concentration, C, verses magnetic field strength, H. This concentrating effect is symbolized by the magnetic separation of magnetic nanoparticles 180 from its carrying fluid a suggested by inset diagram 226 comparing a nonseparated sample in a test tube on the left with the magnetically separated sample in a test tube on the right. Inset graph 230 is a graph of normalized concentrations verses time for different initial concentrations illustrating the dynamic response to be expected on the application of a magnetophoretic force. Inset 232 is a diagram illustrating magnetic loading of magnetic nanoparticles 180 on a membrane of a target cell labelled with magnetic particles of various sizes or magnetic moments.

The SAW detector 38 is not only a highly sensitive mass sensor, but a viscosity sensor as well. Blood and plasma are both highly viscous materials that can bury any phase signal attributed to specificity of the target of interest. To mitigate this interaction, the conjugated target analyte-magnetic nanoparticles 180 must be removed from the plasma solution and transferred to a low viscosity PBS buffer solution.

Figure 21A:
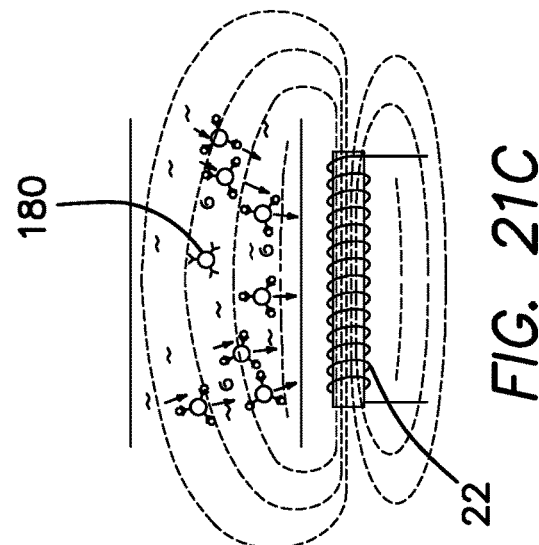
FIGS. 21A-21F are diagrams showing the sequence for using magnetically actuated nanoparticles in a fluid exchange protocol in both the mixing chamber and SAW chamber.
Figure 21B:
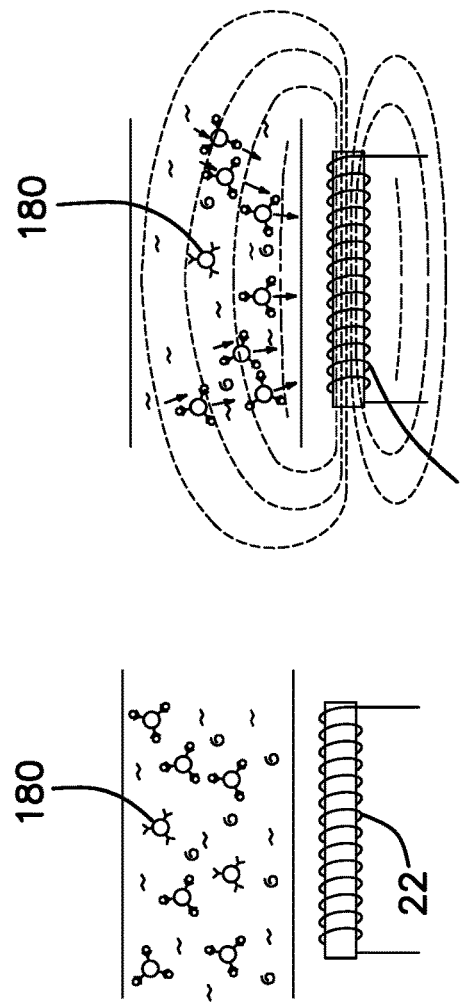
Figure 21C:
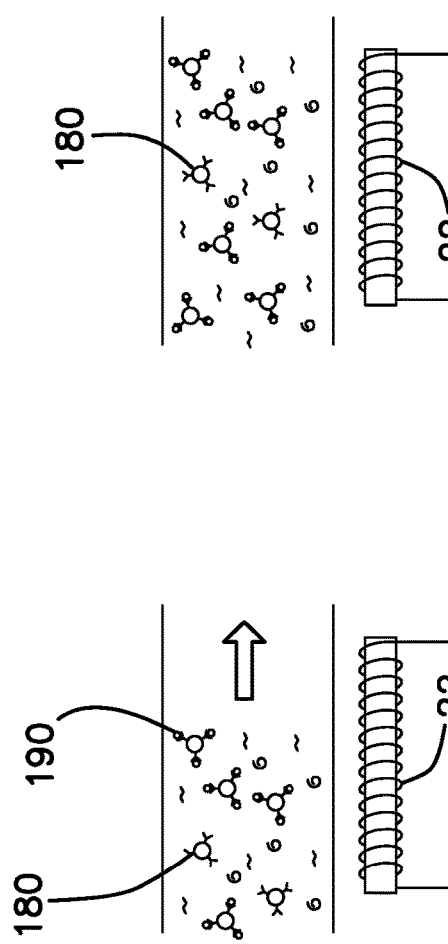
Figure 21F:
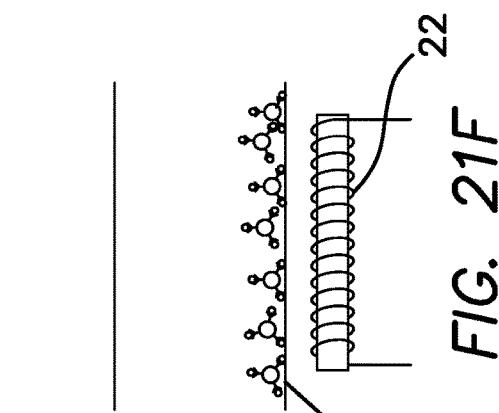
Figure 21E:
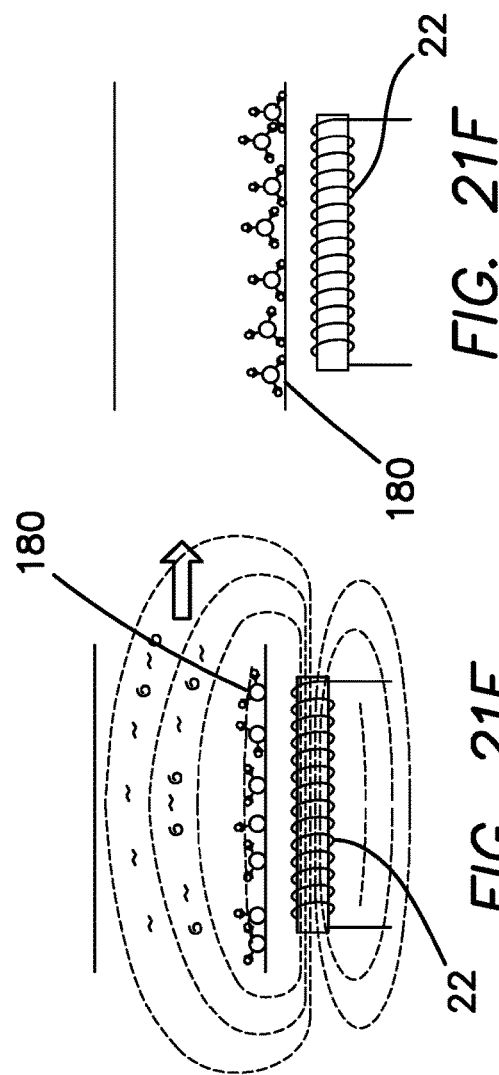
Figure 21D:
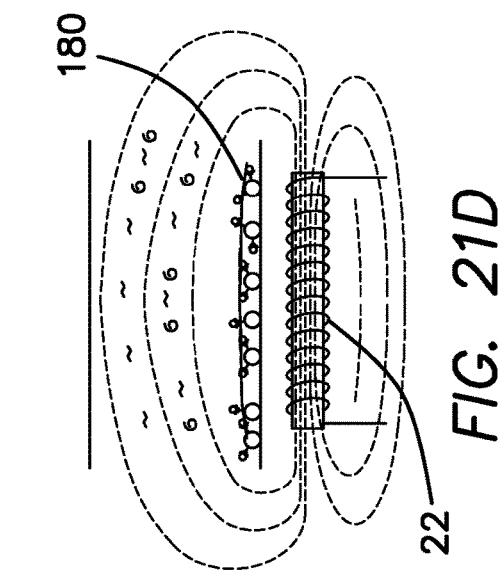

FIGS. 21A-21F show that for fluid exchange to occur in step 118, the analyte-magnetic bead conjugate is held in place against a surface of the mixing chamber 18 by the use of a selectively controlled electromagnet or a movable permanent magnet 22 located underneath the chamber 16 in the reader 20. FIGS. 21A-21F illustrate an embodiment in which magnet 22 is a selectively controlled electromagnet to apply or activate the magnetic field and magnetic movement of the magnetic nanoparticles 180. However, in the illustrated embodiments permanent magnet 22 is raised into near contact with the surface of disk 13 in order to effectively activate or bring the magnetic field into play with respect to magnetophoretic movement of the magnetic nanoparticles 180 in FIGS. 21C-21E. The applied magnetic field draws the magnetic particles 180 onto the surface of chamber 16 and holds them in place, while centrifugation draws the plasma from the chamber 16 in FIG. 21D which is replaced with PBS in FIG. 21E. In the case of the use of a selectively controlled electromagnet is energized in FIG. 21C leading to the same chamber wall affixation in FIG. 21D. The magnetic actuation prevents the conjugates from traveling downstream with the blood plasma when it is evacuated. What remains after the fluid exchange is a PBS buffer containing only the conjugates of interest, as well as unconjugated magnetic particles as shown in FIG. 21F.

In the fluid exchange step 118 in FIG. 8 disk 13 is spun to apply the spin forces to the fluid which is to be moved by turning magnet 22 on or placing it in an effectively close enough position to apply the magnetic field to selectively fix the magnetic nanoparticles 180 to the chamber walls of mixing chamber 16. The magnetic nanoparticles 180 are subjected to a pulsed magnetic field at a frequency determined by the rpm of disk 13. The frequency of the effectively pulsed magnetic field is selected according to the magnetophoretic properties of the magnetic nanoparticles 180 in the plasma so that the rpm is not low as to provide insufficient force to move the plasma out of mixing chamber 16 but not so high such that the magnetic pulses are too short to effectively move and affix magnetic nanoparticles 180 to the walls of mixing chamber 16.

Selective magnetic affixation of the conjugated magnetic nanoparticles 180 may be performed in SAW chamber 26 as in conjugation step 120 with the disk 13 in a stationary position as indicated in FIG. 8 to overcome diffusion limitations and to assist in capture of the conjugated magnetic nanoparticles 180 onto the active or functionalized sensing lanes 201 prior to measurement. In FIG. 8 application of magnet 22 in fluid exchange step 134 with disk 13 spinning is denoted as magnet B1 with magnet 22 in fluid conjugation step 120 with disk 13 pulsed to assist in mixing in SAW chamber 26 is denoted as magnet B2. Disk 13 is pulsed to assist in mixing or distribution of the analyte over active SAW functionalized sensing lanes 201 during rotational pulses and with the disk 13 positioned to place SAW chamber 26 over magnet 22 during nonrotational pulses to assist in analyte capture by magnetophoretic driving forces on magnetic nanoparticles 180.

In addition to removing any nonspecific proteins and viscous plasma sample, a fluid exchange in step 118 also allows for the concentration of the analyte conjugates to be greatly increased. A fluid sample of 500 microliters of plasma with the conjugates transplanted into a 50 microliter PBS buffer solution, has effectively had a concentration increase of 10 times.

Due to the kinetics of the sensor antibodies, an increase in concentration allows for a greater propensity for capture, which results in an increased Limit of Detection (LOD), even though the total number of target conjugates remains constant.

Magnetic Conjugation (No Translation Only Torque)

To overcome the inherent challenges associated with diffusion, the use of magnetic nanoparticles 180 allows for site directed manipulation of the suspended half-immunoassay magnetic nanoparticles 180. By utilizing magnetism, the diffusion timescale, which when left to its own accord could take hours to enable a suspended particle to diffuse to the surface, instead this application uses magnetic forces to very quickly draw the magnetic nanoparticle 180 to the sensor surface.

The challenge associated with using an electromagnet 22 is the drawing of power from the device and the local increase in temperature. By using a rare earth magnet, such as an NdFeB magnet, allows for magnetic field strengths of 0.5 Tesla, for example, at a large magnetic-field-to-size ratio. To prevent accumulation of the magnetic nanoparticles 180 along the magnetic field lines, a magnet surface area greater than the SAW detector 38 is chosen to allow for a uniform gradient of magnetic field strength at the surface of the SAW sensor lanes footprint.

In addition, a magnetic field allows for a greater degree of rotation of a magnetic nanoparticles 180, as they rotate to align with the magnetic field lines. This rotation results in an increased propensity to conjugate as the rotation of the nanoparticles 180 increases the chance of an analyte and sensor antibody to find each other in the right orientation and make an immunoassay binding.

Given the thickness of the SAW sensor 38 as the closest distance the magnet can approach the fluid, and a magnetic strength of, for example, 0.5 Tesla to attract magnetic nanoparticles 180, by displacing the magnet roughly 1 cm away from the SAW surface of lanes 40, the magnetic field strength decays to $\frac{1}{100}$ of its maximum field strength, resulting in the suspended magnetic nanoparticles 180 field of approximately 50 Gauss, which is below the minimum threshold for the magnet to act upon the nanoparticle.

The magnet 22 is located on a mechanical arm (not shown) that travels below the microfluidic disk 13 and, when given commands by the microcontroller 54, moves into near-contact with the disk 13 to allow for magnetic actuation of the particles to occur at varying stages of mixing, conjugation, and cleanup. The arm moves freely in the radial direction as well to allow the magnet 22 to be moved as necessary to the various reservoirs and chambers in the fluidic circuit to allow for mixing, conjugation and cleanup to occur.

Active Valves+Lasers or LED

The use of complex biochemical sequencing requires fluids to be administered sequentially in order to perform the necessary steps of separation, mixing, conjugation and cleanup. Fluid held in various reservoirs must be held in place until the point in the sequencing that it is required. In LoaD microfluidics, fluid can either be retained via passive and active valving. For this application, the use of active valving is required as shown in FIG. 19.

In the microfluidic circuit, fluidic chambers and channels are milled into the top and bottom of a black polymer disk 13. To plug a channel, half of the channel is milled into the top part of the disk 13 for laser valves 202, 203, 204 as the front channel 222 and half is milled into the bottom part of the disk 13 as back channel 220. A portion of channel 222 and channel 220 overlaps, shown cross sectionally in FIG. 19A. The fluid moves radially from the center of the disk 13 to the edge. Fluid is halted by the termination of channel 222.

Figure 19A:
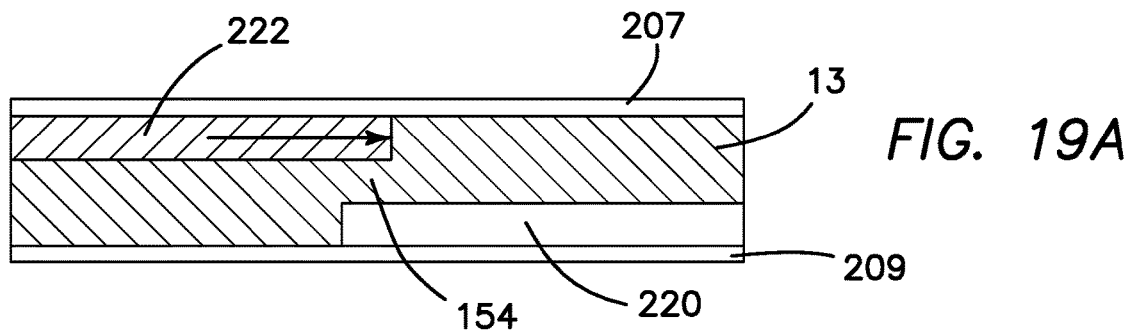
FIGS. 19A-19D are side view diagrams showing how lasers are used to control active valves.
Figure 19B:
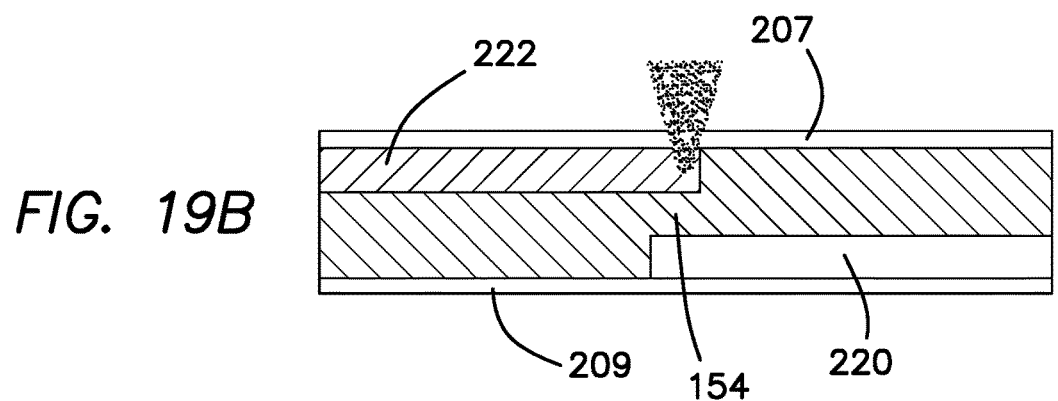
Figure 19C:
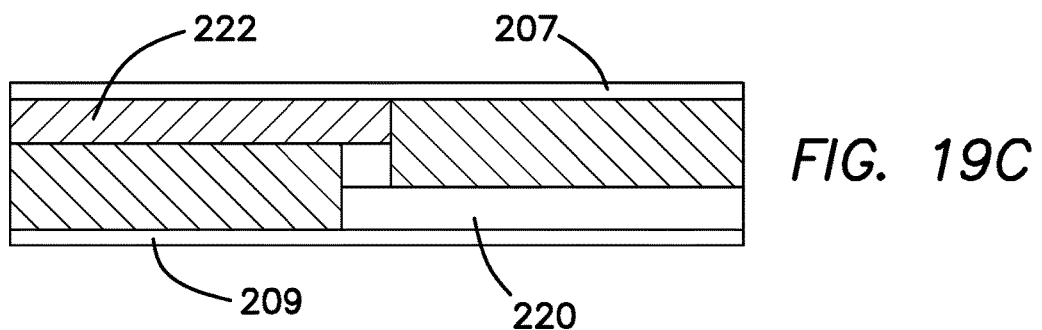
Figure 19D:
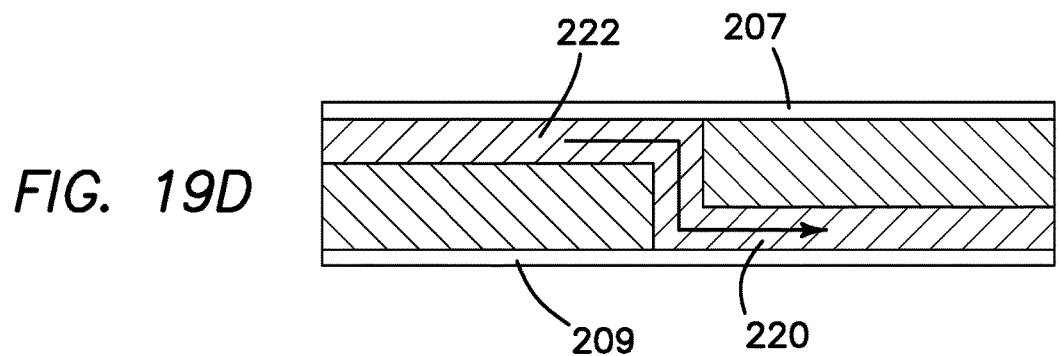

The reader 20 contains a 1 W blue laser diode 156 in FIG. 5 at a fixed location under the disk 13 corresponding to a fixed radius in the fluid circuit. When the laser diode 156 is fired onto the overlapping region between channels 222 and 220 as shown in FIG. 19B, the black plastic plug 154 melts as shown in FIG. 19C, allowing for any fluid to freely move through the fluidic circuit from channel 222 to channel 220, as shown in FIG. 19D. The use of active valving allows for various elements of mixing, fluid exchange and cleanup that would otherwise be impossible in a linear flow LoaD, and allows for more complex geometries to be imprinted onto the disk 13 while still preserving an ability to have sequencing.

Mixing

In the lab-on-a-disk (LoaD), the separated blood plasma must be mixed with a buffer containing functionalized magnetic nanoparticles 180 to enhance the mass of the target in question and allow for complex sequencing to occur. Mixing is generally a challenge in microfluidic systems due to the presence of laminar flow, where fluid travels in overlapping sheets and velocity and pressure remain constant at each point in the flow. In fluid mechanics, the Reynold's number is the ratio of the inertial forces to the viscous forces. At low Reynold's numbers (laminar flow regime), fluid is dominated by viscous forces, rather than inertial or turbulent forces, preventing mixing between particles in a solution. Without turbulence, microfluidic devices must rely on either passive molecular diffusion or external energy sources to mix. In a microfluidic disk 13, the pseudo forces present on a rotating platform can be harnessed to increase advection and chaotic mixing in fluid chambers. In particular, the Euler pseudo force, which is perpendicular to the centrifugal pseudo force and opposite the direction of angular velocity, can be used to generate vortical flow and provide uniform mixing within a chamber. The Euler force, per unit volume, can be expressed as:

$$\vec{F_E} = -\rho \frac{d\vec{\omega}}{dt} \times \vec{r}$$

where p is the liquid density, $\frac{d\vec{\omega}}{dt}$ is the change in the angular velocity per unit time, and $\vec{r}$ is the mean distance of the liquid from the center of the disk 13. The Euler force is only present when the angular velocity of the disk 13 changes with respect to time, either through acceleration/deceleration of the disk 13 or through a change in the direction of rotation. In a microfluidic disk 13, turbulent mixing is dependent on the geometry of the chamber (distance from center, chamber height, chamber width, and chamber volume), the rate of acceleration/deceleration, and the angular span of the mixing chamber. Therefore, by changing the rotational speed of the disk 13, and/or by alternating the direction periodically across an angular span, the sheer driven advective current in the mixing chamber 16 rapidly homogenizes the two fluids and allows for conjugation between a target analyte in a plasma sample and the functionalized magnetic nanoparticles 180 to occur on the timescale of seconds (Euler-based mixing) rather than minutes (passive-diffusion).

Wash

Before taking a measurement, the sensor surface of lanes or SAW channels 40 of detector 38 must be thoroughly washed to remove any nonspecifically bound proteins and magnetic nanoparticles 180. The presence of nonspecifically bound mass on the SAW sensor 38 results in false positive readings and must be removed prior to taking a measurement. There are two wash reservoirs 24, 201 upstream from the sensing chamber 16 so that after conjugation has occurred, reservoir 24 and reservoir 201 are opened sequentially via laser valves 203 and 204 and allowed to flow over the SAW sensor 38. The PBS removes any unconjugated mass attached to the SAW surface of lanes 40 and allows for a reading to be taken that only considers mass that is specifically bound the antibody surface through a sandwich EUSA—like immunoassay scheme.

Dry Film Measurement

In addition, the microfluidic platform utilizes centrifugal forces to increase the angular velocity of the wash and remove the wash liquid from the sensor surface of lanes 40 and to do a final dry wash to remove unbound proteins and magnetic nanoparticles 180 from the surface. Because the sensor 38 is sensitive to viscosity, removing the PBS buffer solution from the sensor surface of lanes 40 results in increased device resolution.

Arc Section Encoder

For many stages of the microfluidic process, interface with either a permanent magnet 22, or a RF interposer 148 must contact the flex-PCB 151 printed on the underside of the disk 13 to take an electrical measurement, requires precise locality and knowledge of the disk arc-section within the reader 20.

Encoders 146 located on the mechanism of motor 44 do not have the precision required for making a reliable RF connection to SAW detector 38. For highly accurate positional information, an encoded marking on the disk 13, referred to herein as a code wheel, allows for not only detection of the cartridge or disk location by encoder 146 to detect adjacent radial index markings, but also for measurement of any wobble and is independent of any mechanical flex between the disk 13 and the chuck 48 attached to the motor shaft that holds the disk 13 in place.

The chuck 48 is hexagonal in shape, and contains spring loaded ball bearings (not shown) to create torsional stress to hold the disk 13 in place at high rotational speeds, up to 4000 RPM. Additionally, the bearings are weighted to increase proportionally to the rotational speed of the disk 13, as the centrifugal force drives them against the disk 13, allowing the transfer of additional torsional force.

A reflective barcode (not shown) located on the perimeter of the disk 13 contains not only positional data, but also information regarding the cartridge test type, such as target antibody, to be used by the reader 20 for informatics and algorithmics, and for checking the data against a saved lookup table to produce a meaningful correlation between phase shift and blood concentration.

RF Interposer Mechanical Arm

Figure 4A:
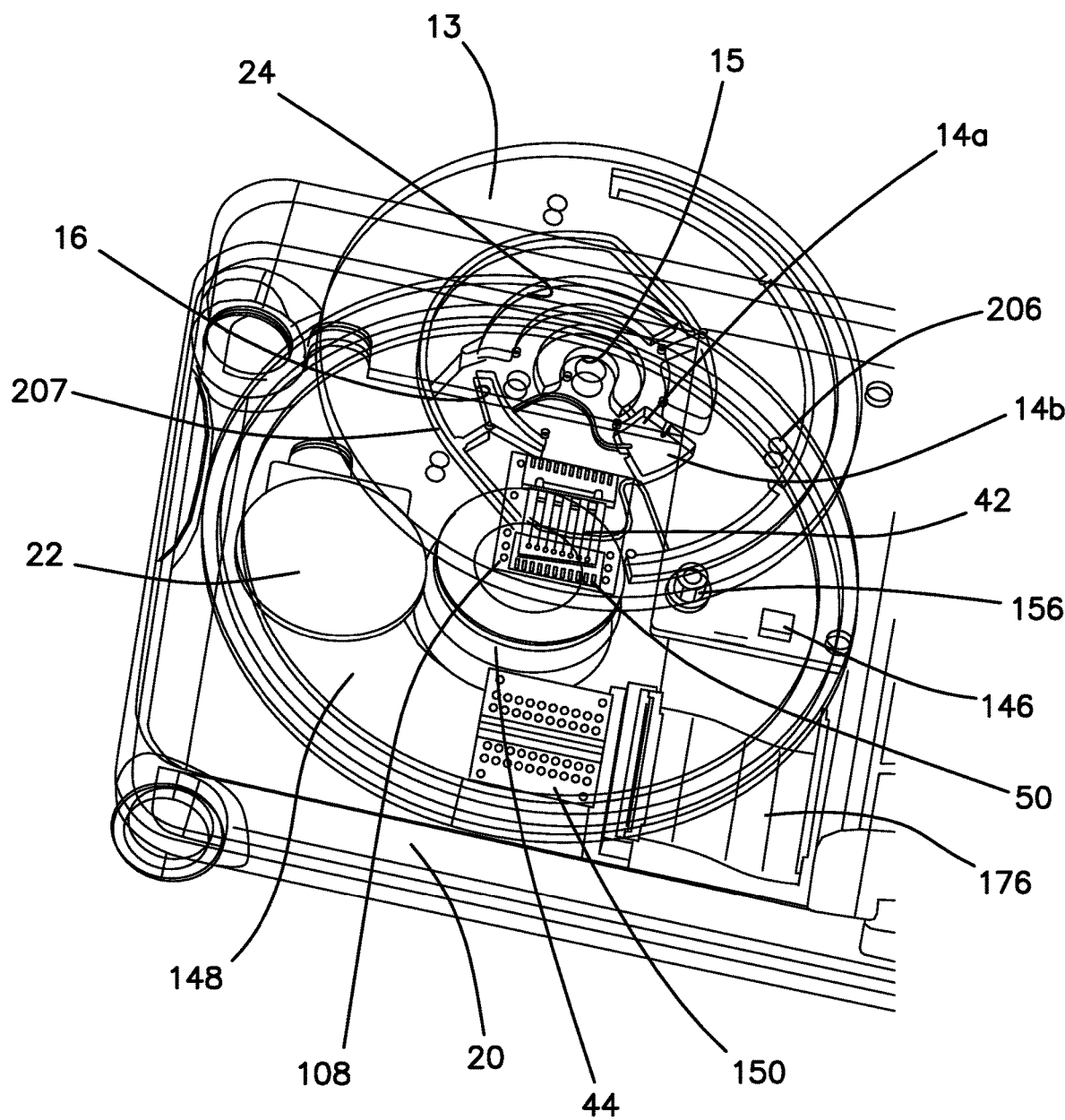
FIG. 4a is an exploded perspective view of the disk and spindle motor, permanent magnet, the RF interposer, the RF sockets, and the opposing SAW chip and SAW chip contacts in the disk.
Figure 4B:
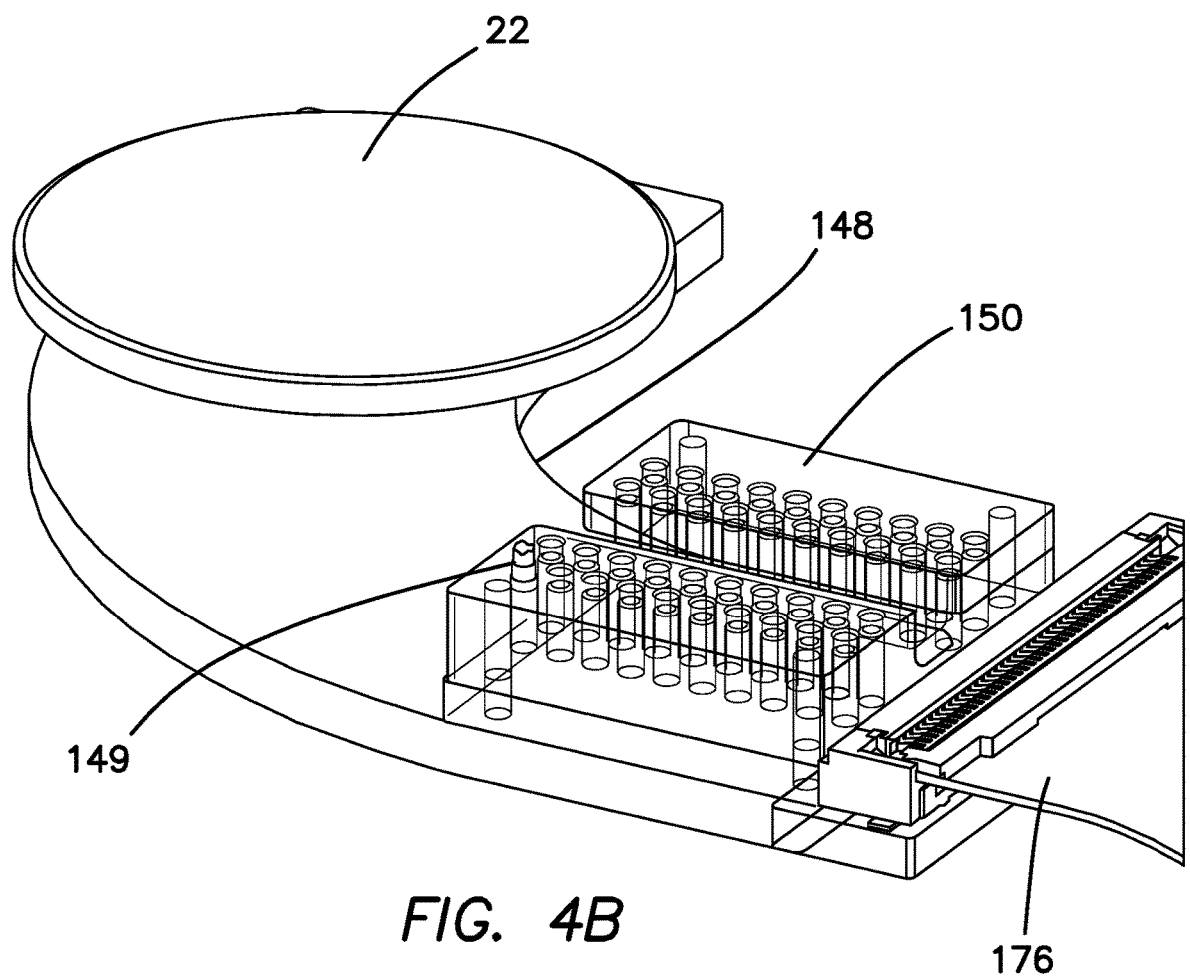
FIG. 4b is a perspective view showning the RF interposer, permanent magnet and RF sockets in isolation.

FIG. 4a shows in an exploded perspective view the RF mechanical interposer 148 that contains both the RF electrical sockets 150 that are electrically communicated through ribbon flex connector 176 to PCB board 164. SAW chip 42, located on or in the microfluidic disk 13, is selectively coupled to RF sockets 150 when RF sockets 150 along with permanent magnet 22 are raised by interposer 148 selectively actuated by z motor 46. Magnet 22 is used in the fluid exchange step 118 and the conjugation step 120 of the microfluidic process of FIGS. 7 and 8. The mechanical Interposer 148 is mounted in reader 20 and coupled to Z-axis motor 46 that moves the mechanical Interposer 148 relative to the disk 13, and into contact with a SAW printed circuit board 108 that is wire bonded to the SAW chip 42. In the illustrated embodiment 20 contacts on SAW PCB 108 are wired into corresponding contacts on SAW chip 42 to provide RF measurement and control signals to SAW chip 42m that allows for contact and readings to be made when a measurement is made in the measurement step 126. The contacts on PCB 108 on the underside of disk 13 makes contact with a corresponding number of spring-loaded, telescopic electrical top-hats 149, one of which is better shown in FIG. 4b that connect via a ribbon PCB 176 to the reader 20 for bidirectional transmission of signals to and from SAW chip 42. A conical alignment pin (not shown) may also be provided on interposer 148 to mate in an opposing alignment hole (not shown) in disk 13 just prior to the contact of top-hats 149 with the contacts on PCB 108, so that precise azimuthal alignment is assured between the contacts on PCB 108 and RF sockets 150, when interposer 148 is raised.

Reader 20 includes a laser 156 mounted below disk 13 at a predetermined radial distance from center 15 for use in the active valving as discussed below in connection with FIGS. 19a-19D. Also located in reader 20 is a lensed Allen-Bradley encoder 146 for reading azimuthal fiducial markings 147 best seen in FIG. 5. FIG. 5 is a top plan view showing disk 13 loaded into the reader 20. RF mechanical interposer 148 that contains the flex PCB connections and the RF sockets 150, the permanent magnet 22 and the laser diode 156. Also shown is disk chuck 48, which may be keyed or hexagonal, if desired for purposes of rigidity or alignment, although in the preferred embodiment, chuck 48 is smoothly cylindrical, since Allen-Bradley encoder 146 is sufficient to provide absolute azimuthal position tracking, which is required for the fixed positions of the microfluidic circuit elements defined into disk 13.

Figure 6:
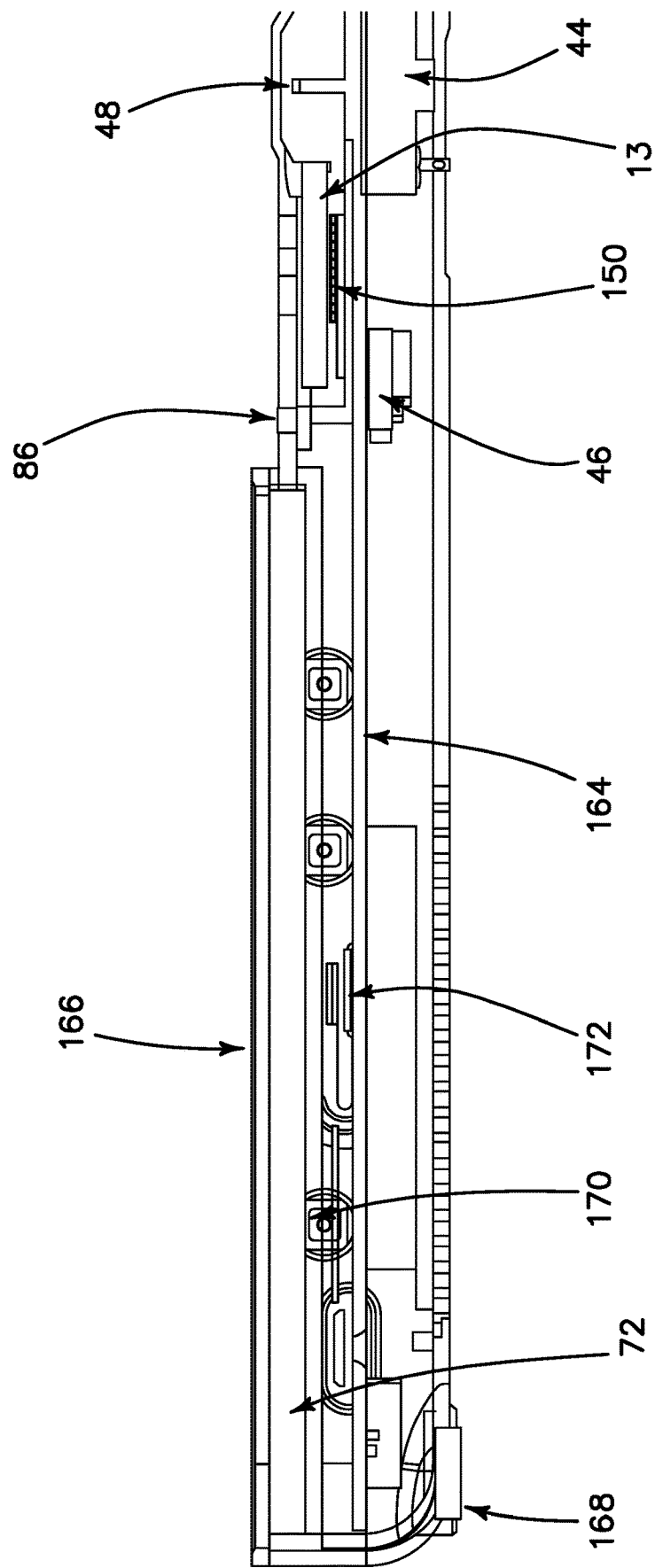
FIG. 6 is a side cutaway view of the reader as seen along a longitudinal sectionline of the reader.

FIG. 6 is a cut-away side view of the reader 20 and PCB board 164. The capacitive glass 166 displays the general user interface (GUI) of the system 10 and allows for the user to interface with the reader 20 while protecting the touch screen 72. Shock absorbing feet 168 protect the reader PCB 164 and ensure that no vibrations effect the reading. Various buttons 170 allow for the user to control the reader 20. A serial digital (SD) card reader 172 allows for data to be stored and removed for analysis from system 10. The Z axis motor 46 drives the RF socket 150 into contact with the microfluidic disk 13. An on-board motor 44 drives the disk 13 which is locked in place via a hexagonal chuck mechanism 48.

FIG. 8 is a graph of the data coming from the SAW detector 38 during conjugation step 120. The functionalized active channels 40 exhibit a phase shift as binding of a target analyte onto their surface occurs. A phase shift measurement is taken between the three active channels and one reference lane, and the differential value is output as the phase change, which corresponds to a concentration of analyte in the starting sample.

General User Interface (GUI)

The architecture of the hardware and the sequencing of the methodology having now been described, the general user interface (GUI) employed and displayed in the control of reader 20 can be appreciated. The GUI includes at a plurality of screens on display 74: 1) a flash screen showing an entry or initial announcement screen in FIG. 23A; 2) an account management screen in FIG. 23B; 3) an account screen in FIG. 23C; 4) a Log-In account in FIG. 23D; 5) a set-up screen in FIG. 23G; 6) a home screen in FIG. 23F; 7) a results screen in FIG. 23G with selected display options such as a display of absolute values of all channels in FIG. 23H, a selected zoom-in point with a selected reference channel for display of delta values in FIG. 23I, and a variable zoom as in FIG. 23J.

Figure 23A:
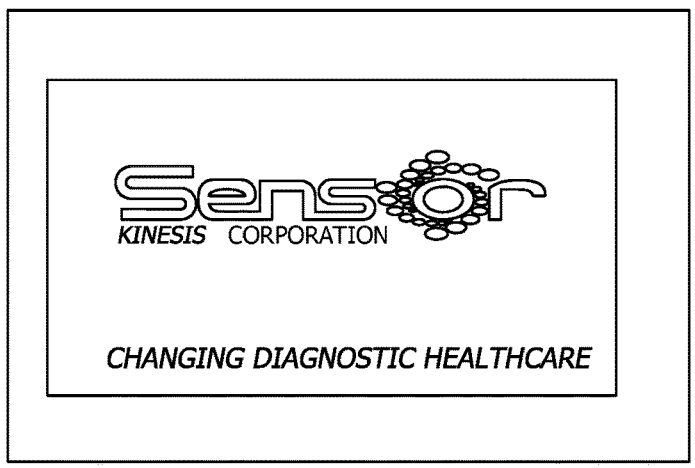
FIGS. 23A-23K illustrate various display screens in the general user interface and various operational modes of the reader.
Figure 23B:
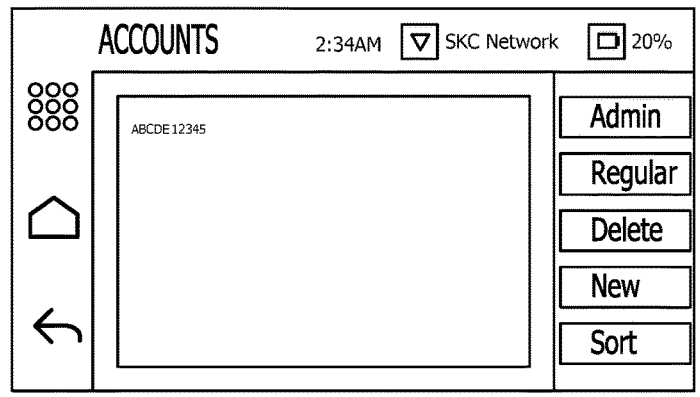
Figure 23C:
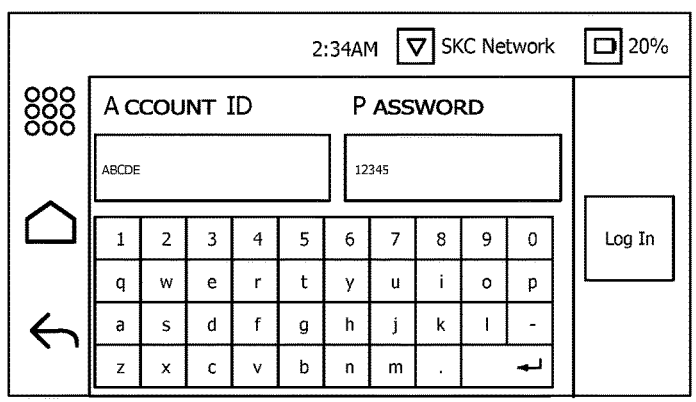
Figure 23D:
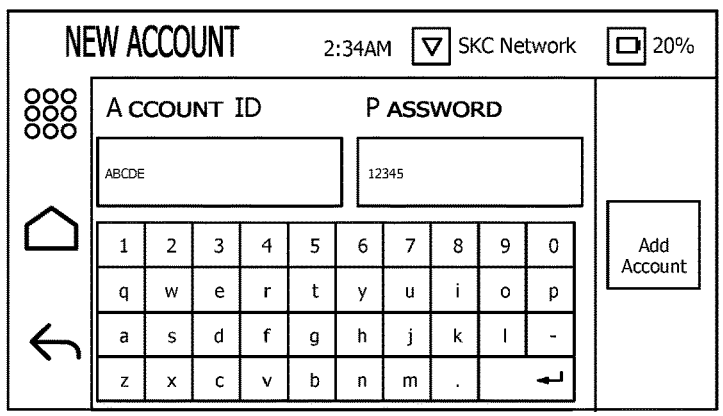

The flash screen in FIG. 23A shows a trademark and title screen which serves to identify that reader 20 is in an initial state ready for use. The account screen of FIG. 23B allows each measurement run to be separately identified by patient account or other designation inasmuch as reader 20 is intended to be used for a plurality of different patients or accounts with the results of the measurements for each account to be stored in reader 20. The account manager allows handling of the accounts by a default or regular classification, by an administrator controlled classification, to be deleted, added as new or to have multiple accounts identified and sorted on the display screen. If the account is new it can be created through the account creation screen in FIG. 23C or if it is an existing account, it can be accessed through log-in account screen in FIG. 23D.

Figure 23E:
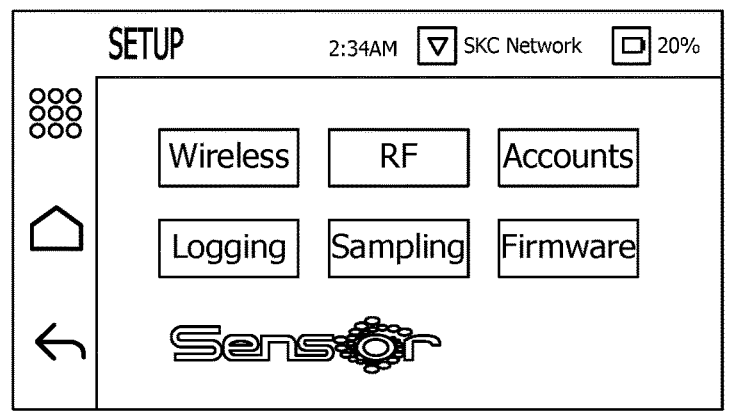

The setup screen in FIG. 23E is the entry point for configuration of reader 20, which includes wireless or Wi-Fi set up, RF signal generator configuration for SAW detector 38, user account management, logging configuration relating to error, information, warning or other status indicators, sampling parameters, and firmware identification.

Figure 23F:
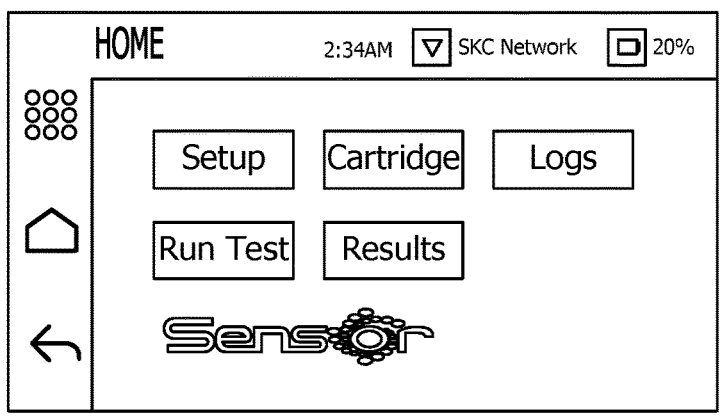
Figure 23G:
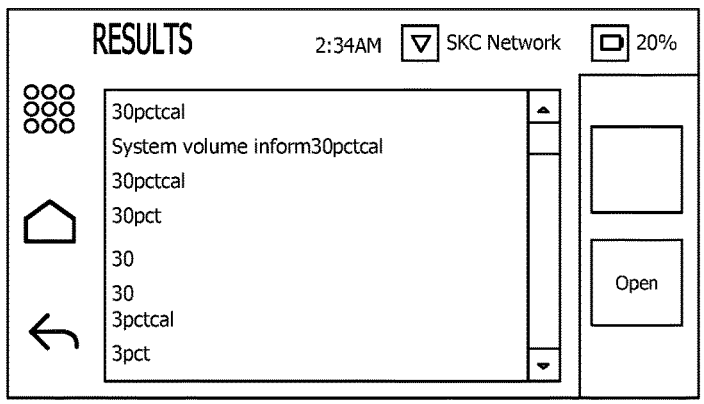
Figure 23H:
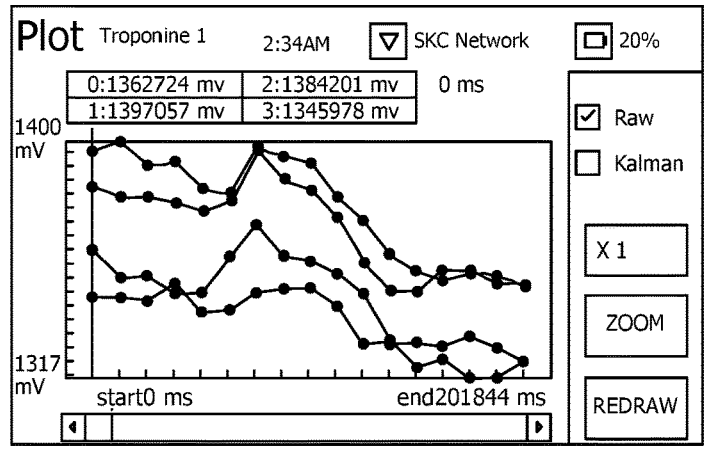
Figure 23I:
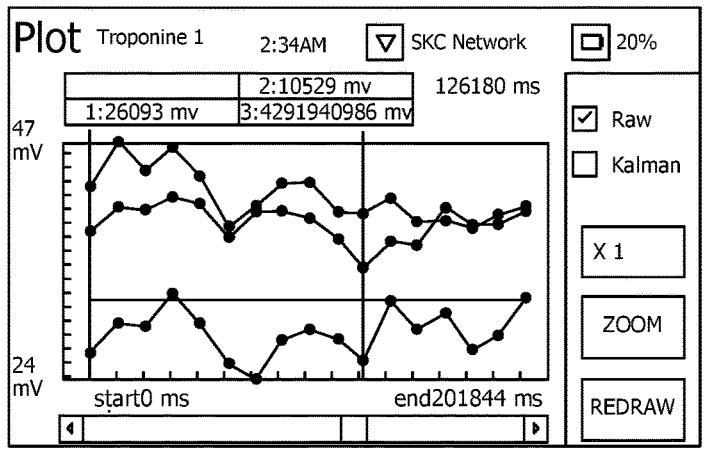
Figures 23J, 23K:
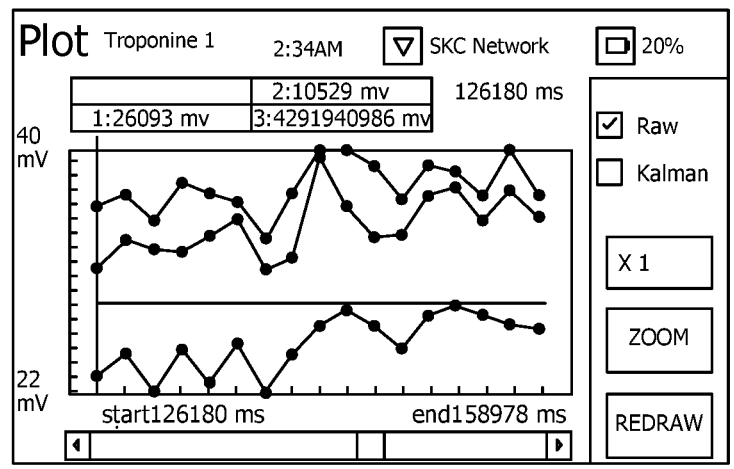

The home screen in FIG. 23F is the entry point to every category of operation of reader 20, such as the setup screen in FIG. 23E, a cartridge screen related to disk parameters, a logs screen, a run test diagnostic, and results screens as shown in FIGS. 23G-23J. The results screen of FIG. 23G allows a selected data file to be accessed for display. The display may be the absolute values of the measurements as a function of time for each reference and measurement channel in SAW detector 38 as shown in FIG. 23H, or specific data time can be selected and a zoom display of that time and channel displayed as shown in FIG. 23I with a variable degree of zoom as shown in FIG. 23J.

A test input screen as shown in FIG. 23K allows the measurement parameters, such as sweep, calibration and measure, to be chosen and correlated to a data file. The RF state machine programmed into CPU 54 controls the stages of each operation of reader 20. A measurement display is provided similar to the results display described above. The measurement data is saved to SD card 82 with the file name, file description and other related information.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The disclosure can be better visualized by turning now to the following drawings wherein like elements are referenced by like numerals.

We claim:

1. A field portable diagnostic apparatus comprising:
a rotatable disk having a center;
a septum for providing closure of a microfluidic circuit while allowing insertion of a sample with a target analyte;
a sample reservoir sealed by the septum for holding the sample, the sample reservoir being defined into the disk beginning at a first radial position;
a separation chamber communicated to the sample reservoir, the separation chamber defined into the disk beginning at a second radial position further from the center of the disk than the first radial position of the sample reservoir and in which separation chamber centrifugal forces stratify the sample;
a magnetic bead holding reservoir defined into the disk beginning at a third radial position further from the center of the disk than the first radial position of the sample reservoir;
a separation siphon communicated to the separation chamber;
a mixing chamber communicated to the separation chamber through the separation siphon, where mass amplifying functionalized magnetic-nanoparticles, held in a buffer solution and contained in the magnetic bead holding reservoir communicated to the mixing chamber are mixed with a separated fluid delivered to the mixing chamber from the separation chamber, the functionalized magnetic-nanoparticles conjugating in the mixing chamber with a target analyte in the sample, the mixing chamber defined into the disk beginning at a fourth radial position further from the center of the disk than the first, second and third radial positions;
a surface acoustic wave detector (SAW) having a SAW sensor surface;
a first valve controlled channel defined in the disk;
a surface acoustic wave (SAW) chamber communicated to the mixing chamber through the first valve controlled channel, the SAW chamber containing the surface acoustic wave detector (SAW), the SAW chamber defined into the disk beginning at a sixth radial further from to the center of the disk than the fourth radial position;
a movable magnet which is selectively positionable in proximity to the SAW chamber to draw the functionalized magnetic-nanoparticles toward antibodies immobilized on the SAW sensor surface;
a second valve controlled channel defined in the disk;
a phosphate buffered saline solution (PBS) wash reservoir communicated to the SAW sensor chamber, which the PBS wash reservoir contains a PBS solution that is released into the SAW sensor chamber containing the conjugated magnetic-nanoparticles through the second valve controlled channel, the PBS wash reservoir defined into the disk beginning at a fifth radial position closer to the center of the disk than the fourth radial position;
a third valve controlled channel defined in the disk;
a deionized (DI) water wash reservoir communicated with the SAW sensor chamber through the third valve controlled channel, which the DI water wash reservoir containing DI water that is released sequentially following release from the PBS wash reservoir into the SAW sensor chamber containing the conjugated magnetic-nanoparticles, the DI water wash chamber defined into the disk beginning at the same fifth radial position closer to the center of the disk than the fourth radial position;
a waste siphon communicated to the SAW chamber; and
a cleanup/waste reservoir communicated by the waste siphon with the SAW chamber for holding fluid after it has passed through the SAW chamber.

2. The apparatus of claim 1 where the movable magnet is selectively positionable in proximity to the SAW sensor chamber to assist diffusion of magnetic-nanoparticles to the SAW sensor surface.

3. The apparatus of claim 1 where the first, second and third valve controlled channels are each controlled by an active valve.

4. The apparatus of claim 3 where the active valve comprises a thermally activated laser valve.

5. The apparatus of claim 4 where the thermally activated laser valve comprises a laser and a meltable plastic polymer or wax plug disposed in the first valve controlled channel, the second valve controlled channel, or the third valve controlled channel.

6. The apparatus of claim 1 where the first valve controlled channel, the second valve controlled channel, and the third valve controlled channel each comprise a passive valve.

7. The apparatus of claim 1 further comprising a channel communicating the magnetic bead holding reservoir and mixing chamber and a valve disposed in the channel.

8. The apparatus of claim 1 further comprising a reader including a disk motor to rotate the disk, a magnet motor to move the magnet, an RF interposer arm, control, data and power circuitry coupled to the disk motor, magnet motor and RF interposer arm to control and operate the apparatus.

9. The apparatus of claim 1 where the SAW detector comprises multiple functionalized sensing lanes and a reference lane.

10. The apparatus of claim 3 further comprising a laser and an encoder to determine a precise position of the disk relative to the laser, the laser being used to operate the active valves.

11. A field portable diagnostic apparatus comprising:
a rotatable disk with a center;
a microfluidic circuit defined in the rotatable disk;
a separation chamber receiving a sample, the separation chamber defined into the disk across a range of radial positions from the center of the disk so that centrifugal forces stratify the sample into components in the separation chamber when the disk is spun;
a magnetic bead holding reservoir defined into the disk;
a mixing chamber defined into the disk communicated to the separation chamber and to the magnetic bead holding reservoir, where mass amplifying functionalized magnetic-nanoparticles, held in a buffer solution and contained in the magnetic bead holding reservoir communicated to the mixing chamber, are mixed with a separated fluid delivered to the mixing chamber from the separation chamber, the functionalized magnetic-particles conjugating in the mixing chamber with a target analyte in the sample;
a SAW chamber defined into the disk including a surface acoustic wave detector (SAW);
a magnet in proximity to the SAW chamber to draw the functionalized magnetic-nanoparticles toward antibodies immobilized on the SAW sensor surface;
a wash reservoir defined into the disk communicated to the SAW sensor chamber; and
a cleanup/waste reservoir defined into the disk communicated to the SAW chamber for receiving fluid after it has passed through the SAW chamber.

* * * * *